(12) United States Patent
Sakuma et al.

(10) Patent No.: US 12,457,890 B2
(45) Date of Patent: Oct. 28, 2025

(54) METHOD OF MANUFACTURING DISPLAY DEVICE

(71) Applicant: SHARP KABUSHIKI KAISHA, Sakai (JP)

(72) Inventors: Jun Sakuma, Sakai (JP); Yasushi Asaoka, Sakai (JP); Makoto Kitagawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 383 days.

(21) Appl. No.: 18/038,296

(22) PCT Filed: Nov. 25, 2020

(86) PCT No.: PCT/JP2020/043704
§ 371 (c)(1),
(2) Date: May 23, 2023

(87) PCT Pub. No.: WO2022/113179
PCT Pub. Date: Jun. 2, 2022

(65) Prior Publication Data
US 2024/0049585 A1 Feb. 8, 2024

(51) Int. Cl.
*H10K 71/20* (2023.01)
*H10K 71/60* (2023.01)
*H10K 59/80* (2023.01)

(52) U.S. Cl.
CPC .......... *H10K 71/221* (2023.02); *H10K 71/60* (2023.02); *H10K 59/80521* (2023.02)

(58) Field of Classification Search
None
See application file for complete search history.

(56) References Cited

U.S. PATENT DOCUMENTS

2018/0138251 A1  5/2018  Kang

FOREIGN PATENT DOCUMENTS

| CN | 108074953 A | 5/2018 |
|---|---|---|
| JP | 2014120218 A | 6/2014 |

*Primary Examiner* — Anthony Ho
(74) *Attorney, Agent, or Firm* — ScienBiziP, P.C.

(57) ABSTRACT

A method of manufacturing a display device includes: a) a step of preparing a substrate including an electrode and another electrode; b) a step of forming a photosensitive resin material layer on the substrate; c) a step of forming a charge transport material layer and a light-emitting material layer on the substrate; and d) a step of patterning the photosensitive resin material layer, the charge transport material layer, and the light-emitting material layer into a photosensitive resin layer, a charge transport layer, and a light-emitting layer respectively by retaining, without lifting off, non-lift-off portions of the photosensitive resin material layer, the charge transport material layer, and the light-emitting material layer, the non-lift-off portions being provided at least on a part of the electrode, and lifting off lift-off portions of the photosensitive resin material layer, the charge transport material layer, and the light-emitting material layer.

8 Claims, 31 Drawing Sheets

METHOD OF MANUFACTURING DISPLAY DEVICE

TECHNICAL FIELD

The present disclosure relates to methods of manufacturing a display device.

BACKGROUND ART

Most display devices such as organic light-emitting diode (OLED) display devices and quantum-dot light-emitting diode (QLED) display devices include light-emitting elements for a plurality of colors. The light-emitting element for each color includes a charge transport layer and a light-emitting layer.

Suitable materials and shapes, as examples, of such a charge transport layer can vary depending on the color of the light-emitting element including that charge transport layer. Suitable materials and shapes, as examples, of such a light-emitting layer also can vary depending on the color of the light-emitting element including that light-emitting layer. Therefore, in the display device, the charge transport layer and the light-emitting layer included in a light-emitting element for a color are desirably independent from the charge transport layer and the light-emitting layer included in a light-emitting element for another color.

Patent Literature 1 discloses a method of manufacturing an organic EL display device. In this manufacturing method, for a light-emitting element that emits blue light, a light-emitting layer is formed, a transport layer is formed on the light-emitting layer, a lift-off layer is formed on the transport layer, and a photosensitive resin layer is formed on the lift-off layer. The photosensitive resin layer is exposed to light and developed, and a stack of the light-emitting layer, the transport layer, and the lift-off layer is removed from a region not covered by the photosensitive resin layer. In addition, for a light-emitting element that emits red light, a light-emitting layer is formed, a transport layer is formed on the light-emitting layer, a lift-off layer is formed on the transport layer, and a photosensitive resin layer is formed on the lift-off layer. The photosensitive resin layer is exposed to light and developed, and a stack of the light-emitting layer, the transport layer, and the lift-off layer is removed from a region not covered by the photosensitive resin layer.

CITATION LIST

Patent Literature

Patent Literature 1
Japanese Unexamined Patent Application Publication, Tokukai, No. 2014-120218

SUMMARY

Technical Problem

The method of manufacturing an organic EL display device disclosed in Patent Literature 1 needs a long manufacturing process.

The present disclosure has been made in view of this problem. The present disclosure has an object to provide a method of manufacturing a display device, the method being capable of shortening the manufacturing process and of rendering the charge transport layer and the light-emitting layer included in a light-emitting element that emits light of a color independent from the charge transport layer and the light-emitting layer included in a light-emitting element that emits light of another color.

Solution to Problem

The present disclosure, in an aspect thereof, is directed to a method of manufacturing a display device, the method including: a) a step of preparing a substrate including an electrode and another electrode separated by a distance from the electrode in a plan view; b) a step, following step a), of forming a photosensitive resin material layer on the substrate; c) a step, following step b), of forming a charge transport material layer and a light-emitting material layer on the substrate so that an entire region where the charge transport material layer and the electrode overlap and an entire region where the light-emitting material layer and the electrode overlap overlap the photosensitive resin material layer; and d) a step, following step c), of patterning the photosensitive resin material layer, the charge transport material layer, and the light-emitting material layer into a photosensitive resin layer, a charge transport layer, and a light-emitting layer respectively by exposing to light, and developing, the photosensitive resin material layer using a photomask, retaining, without lifting off, non-lift-off portions of the photosensitive resin material layer, the charge transport material layer, and the light-emitting material layer, the non-lift-off portions being provided at least on a part of the electrode, and lifting off lift-off portions of the photosensitive resin material layer, the charge transport material layer, and the light-emitting material layer, the lift-off portions being provided at least on a part of the other electrode.

DESCRIPTION OF EMBODIMENTS

Figure 1:
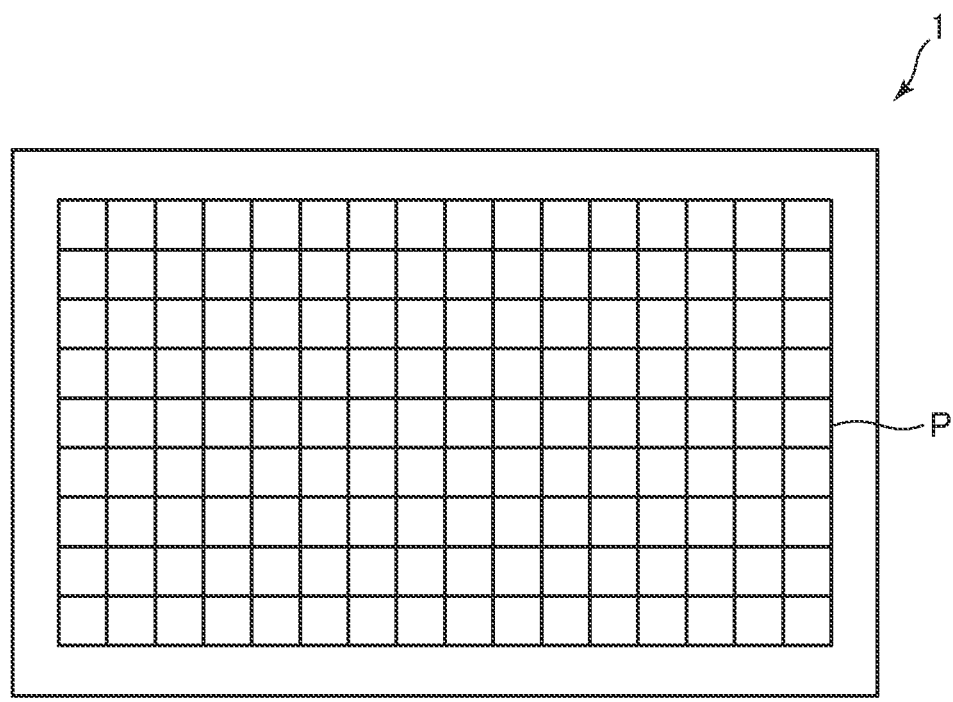
FIG. 1 is a schematic plan view of a display device in accordance with Embodiment 1.

The following will describe embodiments of the present disclosure with reference to drawings. Identical and equivalent elements in the drawings are denoted by the same reference numerals, and description thereof is not repeated.

1 Embodiment 1

1.1 Planar Structure of Display Device

FIG. 1 is a schematic plan view of a display device 1 in accordance with Embodiment 1.

The display device 1 may be, for example, an organic light-emitting diode (OLED) display device or a quantum-dot light-emitting diode (QLED) display device. The following description assumes as an example that the display device 1 is a QLED display device.

Referring to FIG. 1, the display device 1 includes a plurality of pixels P.

The plurality of pixels P are arranged like a matrix. The plurality of pixels P are not necessarily arranged like a matrix.

1.2 Cross-Sectional Structure of Pixels

Figure 2:
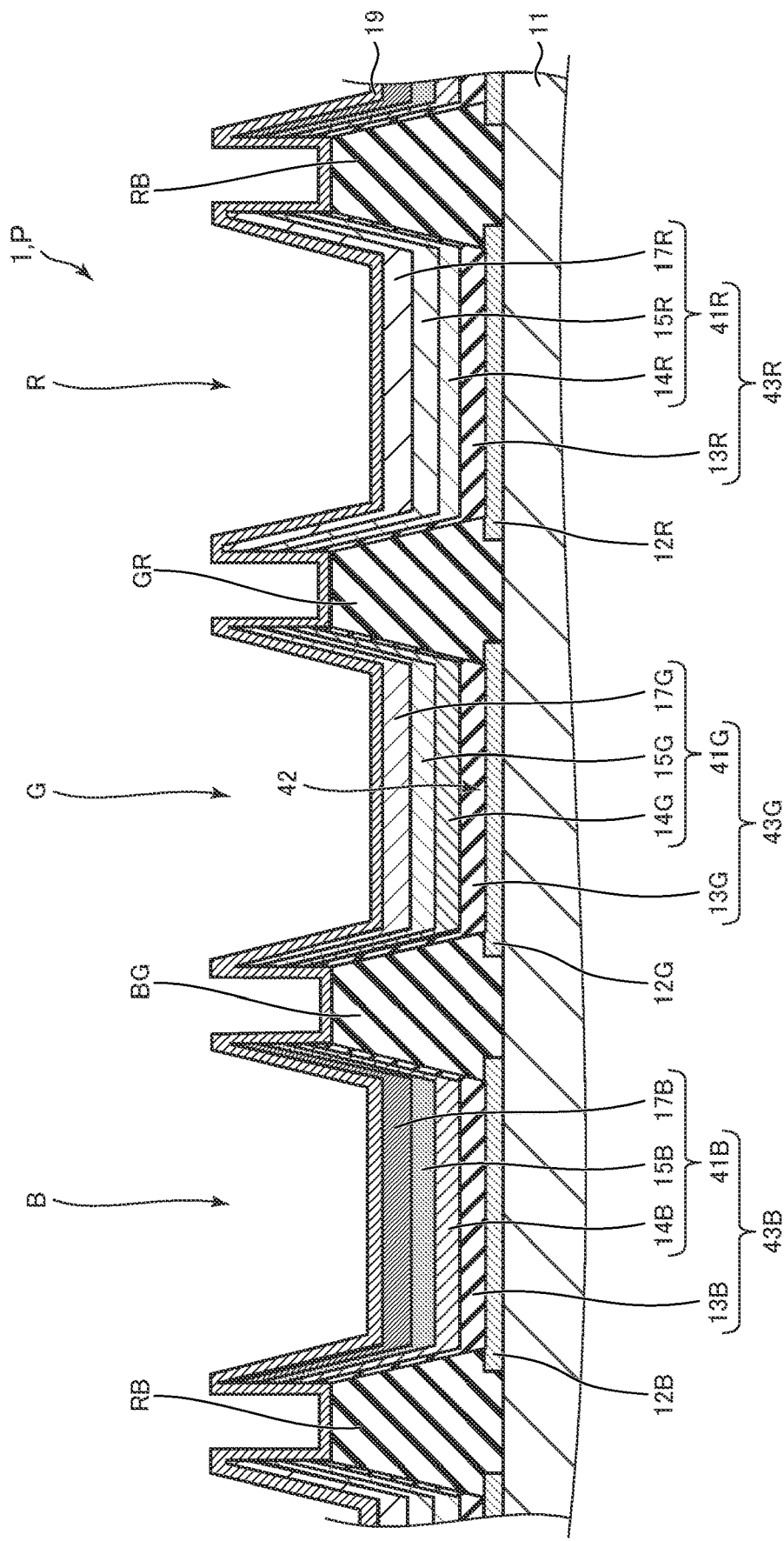
FIG. 2 is a schematic cross-sectional view of each pixel in the display device in accordance with Embodiment 1.

FIG. 2 is a schematic cross-sectional view of each pixel P in the display device 1 in accordance with Embodiment 1.

Referring to FIG. 2, each pixel P includes a first light-emitting element B, a second light-emitting element G, and a third light-emitting element R.

The first light-emitting element B, the second light-emitting element G, and the third light-emitting element R each constitute a subpixel.

The first light-emitting element B, the second light-emitting element G, and the third light-emitting element R emit light of a first color, a second color, and a third color respectively. The first color, the second color, and the third color differ from each other. In Embodiment 1, the first color, the second color, and the third color are blue, green, and red respectively. The first color, the second color, and the third color may be colors other than blue, green, and red respectively.

Referring to FIG. 2, each pixel P includes a first bank BG, a second bank GR, and a third bank RB.

The first bank BG divides the first light-emitting element B and the second light-emitting element G. The second bank GR divides the second light-emitting element G and the third light-emitting element R. The third bank RB divides the third light-emitting element R and the first light-emitting element B.

Referring to FIG. 2, each pixel P includes a substrate 11, a first pixel electrode 12B, a second pixel electrode 12G, a third pixel electrode 12R, a first photosensitive resin layer 13B, a second photosensitive resin layer 13G, a third photosensitive resin layer 13R, a lower, first charge transport layer 14B, a lower, second charge transport layer 14G, a lower, third charge transport layer 14R, a first light-emitting layer 15B, a second light-emitting layer 15G, a third light-emitting layer 15R, an upper, first charge transport layer 17B, an upper, second charge transport layer 17G, an upper, third charge transport layer 17R, and a common electrode 19.

The substrate 11 includes switching elements, wiring, and an interlayer insulating film (none shown). The switching elements are, for example, thin film transistors.

The first pixel electrode 12B, the first photosensitive resin layer 13B, the lower, first charge transport layer 14B, the first light-emitting layer 15B, and the upper, first charge transport layer 17B are included in the first light-emitting element B. The second pixel electrode 12G, the second photosensitive resin layer 13G, the lower, second charge transport layer 14G, the second light-emitting layer 15G, and the upper, second charge transport layer 17G are included in the second light-emitting element G. The third pixel electrode 12R, the third photosensitive resin layer 13R, the lower, third charge transport layer 14R, the third light-emitting layer 15R, and the upper, third charge transport layer 17R are included in the third light-emitting element R. The common electrode 19 is provided across the first light-emitting element B, the second light-emitting element G, and the third light-emitting element R.

The first pixel electrode 12B, the second pixel electrode 12G, the third pixel electrode 12R, the first photosensitive resin layer 13B, the second photosensitive resin layer 13G, the third photosensitive resin layer 13R, the lower, first charge transport layer 14B, the lower, second charge transport layer 14G, the lower, third charge transport layer 14R, the first light-emitting layer 15B, the second light-emitting layer 15G, the third light-emitting layer 15R, the upper, first charge transport layer 17B, the upper, second charge transport layer 17G, the upper, third charge transport layer 17R, and the common electrode 19 are disposed on the interlayer insulating film in the substrate 11. The switching elements and wiring in the substrate 11 are disposed below this interlayer insulating film. Therefore, the first pixel electrode 12B, the second pixel electrode 12G, the third pixel electrode 12R, the first photosensitive resin layer 13B, the second photosensitive resin layer 13G, the third photosensitive resin layer 13R, the lower, first charge transport layer 14B, the lower, second charge transport layer 14G, the lower, third charge transport layer 14R, the first light-emitting layer 15B, the second light-emitting layer 15G, the third light-emitting layer 15R, the upper, first charge transport layer 17B, the upper, second charge transport layer 17G, the upper, third charge transport layer 17R, and the common electrode 19 are separated, and electrically insulated, from the switching elements and wiring. The first pixel electrode 12B, the second pixel electrode 12G, and the third pixel electrode 12R are electrically connected to the switching elements via a connecting conductor disposed inside contact holes formed in the interlayer insulating film.

The first photosensitive resin layer 13B, the second photosensitive resin layer 13G, and the third photosensitive resin layer 13R are disposed on the first pixel electrode 12B, the second pixel electrode 12G, and the third pixel electrode 12R respectively. The lower, first charge transport layer 14B, the lower, second charge transport layer 14G, and the lower, third charge transport layer 14R are disposed on the first photosensitive resin layer 13B, the second photosensitive resin layer 13G, and the third photosensitive resin layer 13R respectively. The first light-emitting layer 15B, the second light-emitting layer 15G, and the third light-emitting layer 15B are disposed on the lower, first charge transport layer 14B, the lower, second charge transport layer 14G, and the lower, third charge transport layer 14R respectively. The upper, first charge transport layer 17B, the upper, second charge transport layer 17G, and the upper, third charge transport layer 17R are disposed on the first light-emitting layer 15B, the second light-emitting layer 15G, and the third light-emitting layer 15R respectively. The common electrode 19 is provided on across the upper, first charge transport layer 17B, the upper, second charge transport layer 17G, and the upper, third charge transport layer 17R.

The first pixel electrode 12B, the second pixel electrode 12G, and the third pixel electrode 12R are separated by a distance from each other in a plan view.

The display device 1 may include an electric charge injection layer between the first pixel electrode 12B and the lower, first charge transport layer 14B, may include an electric charge injection layer between the second pixel electrode 12G and the lower, second charge transport layer 14G, and may include an electric charge injection layer between the third pixel electrode 12R and the lower, third charge transport layer 14R. The display device 1 may include an electric charge injection layer between the common electrode 19 and the upper, first charge transport layer 17B, may include an electric charge injection layer between the common electrode 19 and the upper, second charge transport layer 17G, and may include an electric charge injection layer between the common electrode 19 and the upper, third charge transport layer 17R.

The display device 1 is a differently colored element in which functional layers have different colors. Therefore, a first functional layer 41B including the lower, first charge transport layer 14B, the first light-emitting layer 15B, and the upper, first charge transport layer 17B, a second functional layer 41G including the lower, second charge transport layer 14G, the second light-emitting layer 15G, and the upper, second charge transport layer 17G, and a third functional layer 41R including the lower, third charge transport layer 14R, the third light-emitting layer 15R, and the upper, third charge transport layer 17R are independent from each other. The first photosensitive resin layer 13B, the second photosensitive resin layer 13G, and the third photosensitive resin layer 13R are retained in the display device 1 to render the first functional layer 41B, the second functional layer 41G, and the third functional layer 41R independent from each other. The first photosensitive resin layer 13B, the second photosensitive resin layer 13G, and the third photosensitive resin layer 13R may be partially omitted.

The layers included in the first functional layer 41B, the second functional layer 41G, and the third functional layer 41R are formed simultaneously with the formation by a lift-off process of the first photosensitive resin layer 13B, the second photosensitive resin layer 13G, and the third photosensitive resin layer 13R respectively. In addition, the first photosensitive resin layer 13B, the second photosensitive resin layer 13G, and the third photosensitive resin layer 13R are independent from each other. For these reasons, the layers included in the first functional layer 41B, the layers included in the second functional layer 41G, and the layers included in the third functional layer 41R can be formed independently from each other.

1.3 Emission of Light by Light-Emitting Element

The first pixel electrode 12B, the second pixel electrode 12G, and the third pixel electrode 12R are in contact with the first light-emitting layer 15B, the second light-emitting layer and the third light-emitting layer 15R via the lower, first charge transport layer 14B, the lower, second charge transport layer 14G, and the lower, third charge transport layer 14R respectively. The lower, first charge transport layer 14B, the lower, second charge transport layer 14G, and the lower, third charge transport layer 14R transport first electric charges. For these reasons, the first electric charges can be injected from the first pixel electrode 12B, the second pixel electrode 12G, and the third pixel electrode 12R to the first light-emitting layer 15B, the second light-emitting layer 15G, and the third light-emitting layer 15R via the lower, first charge transport layer 14B, the lower, second charge transport layer 14G, and the lower, third charge transport layer 14R respectively.

The common electrode 19 is in contact with the first light-emitting layer 15B, the second light-emitting layer 15G, and the third light-emitting layer 15R via the upper, first charge transport layer 17B, the upper, second charge transport layer 17G, and the upper, third charge transport layer 17R respectively. The upper, first charge transport layer 17B, the upper, second charge transport layer 17G, and the upper, third charge transport layer 17R transport second electric charges. For these reasons, the second electric charges can be injected from the common electrode 19 to the first light-emitting layer 15B, the second light-emitting layer 15G, and the third light-emitting layer 15R via the upper, first charge transport layer 17B, the upper, second charge transport layer 17G, and the upper, third charge transport layer 17R respectively.

When there is applied an electrical potential difference between the first pixel electrode 12B and the common electrode 19, the first electric charges are injected from the first pixel electrode 12B to the first light-emitting layer 15B via the lower, first charge transport layer 14B. In addition, the second electric charges are injected from the common electrode 19 to the first light-emitting layer 15B via the upper, first charge transport layer 17B. As a result, the first electric charges and the second electric charges recombine in the first light-emitting layer 15B, so that the first light-emitting layer 15B emits light of the first color.

When there is applied an electrical potential difference between the second pixel electrode 12G and the common electrode 19, the first electric charges are injected from the second pixel electrode 12G to the second light-emitting layer 15G via the lower, second charge transport layer 14G. In addition, the second electric charges are injected from the common electrode 19 to the second light-emitting layer 15G via the upper, second charge transport layer 17G. As a result, the first electric charges and the second electric charges recombine in the second light-emitting layer 15G, so that the second light-emitting layer 15G emits light of the second color.

When there is applied an electrical potential difference between the third pixel electrode 12R and the common electrode 19, the first electric charges are injected from the third pixel electrode 12R to the third light-emitting layer 15R via the lower, third charge transport layer 14R. In addition, the second electric charges are injected from the common electrode 19 to the third light-emitting layer 15R via the upper, third charge transport layer 17R. As a result, the first electric charges and the second electric charges recombine in the third light-emitting layer 15R, so that the third light-emitting layer 15R emits light of the third color.

1.4 Inverted Structure and Known Structure

The display device 1 has either an inverted structure or a known structure.

When the display device 1 has an inverted structure, the first electric charges are electrons. In addition, the second electric charges are holes. In addition, the first pixel electrode 12B, the second pixel electrode 12G, and the third pixel electrode 12R are cathodes. In addition, the common electrode 19 is an anode. In addition, the lower, first charge transport layer 14B, the lower, second charge transport layer 14G, and the lower, third charge transport layer 14R are electron transport layers. In addition, the upper, first charge transport layer 17B, the upper, second charge transport layer 17G, and the upper, third charge transport layer 17R are hole transport layers.

When the display device 1 has a known structure, the first electric charges are holes. In addition, the second electric charges are electrons. In addition, the first pixel electrode 12B, the second pixel electrode 12G, and the third pixel electrode 12R are anodes. In addition, the common electrode 19 is a cathode. In addition, the lower, first charge transport layer 14B, the lower, second charge transport layer 14G, and the lower, third charge transport layer 14R are hole transport layers. In addition, the upper, first charge transport layer 17B, the upper, second charge transport layer 17G, and the upper, third charge transport layer 17R are electron transport layers.

1.5 Materials for Each Layer

The first pixel electrode 12B, the second pixel electrode 12G, the third pixel electrode 12R, and the common electrode 19 are made of an electrically conductive material. The electrically conductive material includes, for example, at least one species selected from the group consisting of metals and transparent conductive oxides. The metals include, for example, at least one species selected from the group consisting of Al, Cu, Au, and Ag. The transparent conductive oxides include, for example, at least one species selected from the group consisting of indium tin oxide (ITO), indium zinc oxide (IZO), zinc oxide (ZnO), aluminum zinc oxide (AZO), and boron zinc oxide (BZO). The first pixel electrode 12B, the second pixel electrode 12G, the third pixel electrode 12R, and the common electrode 19 each may be a single layer made of a single electrically conductive material or a stack of two or more layers made of two or more different electrically conductive materials. The two or more layers may include both a layer made of a metal and a layer made of a transparent conductive oxide.

The first photosensitive resin layer 13B, the second photosensitive resin layer 13G, and the third photosensitive resin layer 13R are made of a cured photosensitive resin.

The electron transport layer is made of an electron transporting material. The electron transporting material includes, for example, at least one species selected from the group consisting of zinc oxide, titanium oxide, and strontium titanium oxide. The zinc oxide is, for example, ZnO. The titanium oxide is, for example, $TiO_2$. The strontium titanium oxide is, for example, $SrTiO_3$. The electron transporting material may be an electron transporting material made of a single substance or an electron transporting material made of a mixture of two or more substances.

The hole transport layer is made of a hole transporting material. The hole transporting material includes, for example, at least one species selected from the group consisting of hole-transporting inorganic materials and hole-transporting organic materials. The hole-transporting inorganic materials include, for example, at least one species selected from the group consisting of oxides, nitrides, and carbides of metals. The metals include at least one species selected from the group consisting of Zn, Cr, Ni, Ti, Nb, Al, Si, Mg, Ta, Hf, Zr, Y, La, Sr, and Mo. The hole-transporting organic materials include at least one species selected from the group consisting of 4,4',4"-tris(9-carbazoyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbasol-9-yl)biphenyl (CBP), 2,3,6,7,10,11-hexacyano-1,4,5,8,9,12-hexaazatriphenylene (HATCN), poly(N-vinylcarbazole) (PVK), poly(2,7-(9,9-di-n-octylfluorene)-(1,4-phenylene-(4-sec-butylphenyl)imino)-1,4-phenylene (TFB), poly(triphenylamine) derivatives (Poly-TPD), and poly(3,4-ethylenedioxythiophene)/poly(4-styrene sulfonate) (PEDOT-PSS). The hole transporting material may include a hole transporting material made of a single substance or a hole transporting material made of a mixture of two or more substances.

The first light-emitting layer 15B is made of a blue light-emitting material. The second light-emitting layer 15G is made of a green light-emitting material. The third light-emitting layer 15R is made of a red light-emitting material. The blue light-emitting material, the green light-emitting material, and the red light-emitting material each contain quantum dots. These quantum dots are, for example, semiconductor fine particles with a particle diameter of less than or equal to 100 nm. The semiconductor fine particles include, for example, at least one species selected from the group consisting of Group II-VI compounds, Group III-V compounds, and Group IV compounds. The Group II-VI compounds include, for example, at least one species selected from the group consisting of MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. The Group III-V compounds include, for example, at least one species selected from the group consisting of GaAs, GaP, InN, InAs, InP, and InSb. The Group IV compounds include, for example, at least one species selected from the group consisting of Si and Ge. The semiconductor fine particles may be semiconductor fine particles made of a crystal or semiconductor fine particles with a core/shell structure including: a core made of the crystal; and a shell made of a shell material with a wide band gap and overcoating this core.

The first bank BG, the second bank GR, and the third bank RB are made of an insulator.

1.6 Manufacturing Display Device

Figure 3:
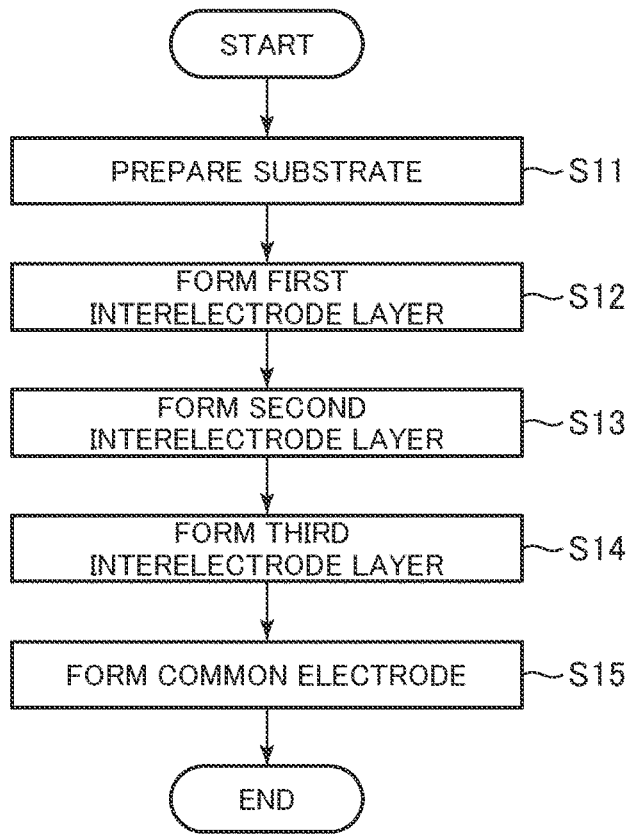
FIG. 3 is a flow chart representing a manufacturing flow for the display device in accordance with Embodiment 1.

FIG. 3 is a flow chart representing a manufacturing flow for the display device 1 in accordance with Embodiment 1.

Referring to FIG. 3, steps S11 to S15 are performed to manufacture the display device 1.

In step S11, a substrate 42 is prepared that includes the substrate 11, the first pixel electrode 12B, the second pixel electrode 12G, the third pixel electrode 12R, the first bank BG, the second bank GR, and the third bank RB.

In step S12 which follows step S11, a first interelectrode layer 43B is formed between the first pixel electrode 12B and the common electrode 19. The first interelectrode layer 43B includes the first photosensitive resin layer 13B, the lower, first charge transport layer 14B, the first light-emitting layer 15B, and the upper, first charge transport layer 17B.

In step S13 which follows step S12, a second interelectrode layer 43G is formed between the second pixel electrode 12G and the common electrode 19. The second interelectrode layer 43G includes the second photosensitive resin layer 13G, the lower, second charge transport layer 14G, the second light-emitting layer 15G, and the upper, second charge transport layer 17G.

In step S14 which follows step S13, a third interelectrode layer 43R is formed between the third pixel electrode 12R and the common electrode 19. The third interelectrode layer 43R includes the third photosensitive resin layer 13R, the lower, third charge transport layer 14R, the third light-emitting layer 15R, and the upper, third charge transport layer 17R.

In step S15 which follows step S14, the common electrode 19 is formed.

1.7 Forming Interelectrode Layer

Figure 4:
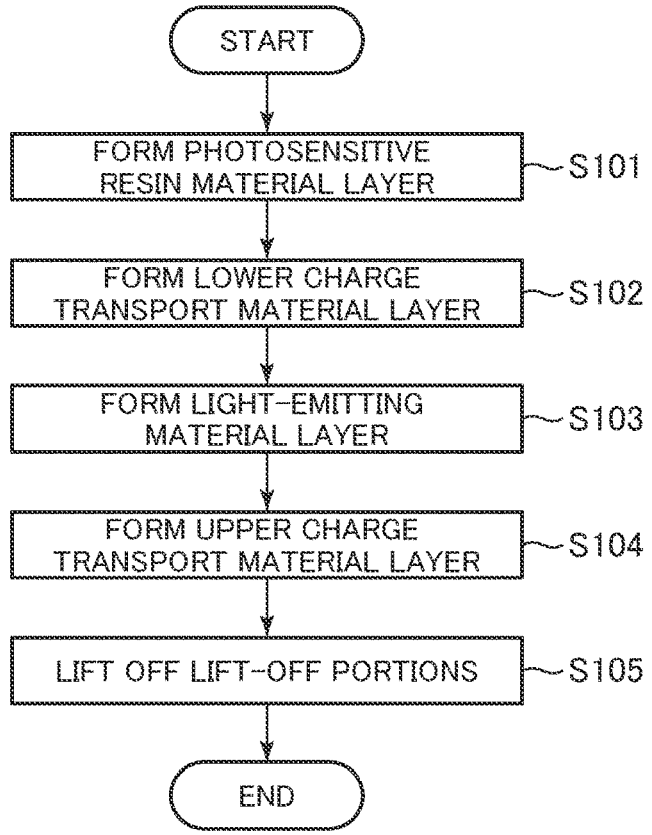
FIG. 4 is a flow chart representing a formation flow for each interelectrode layer in the display device in accordance with Embodiment 1.

FIG. 4 is a flow chart representing a formation flow for each interelectrode layer in the display device 1 in accordance with Embodiment 1.

Referring to FIG. 4, steps S101 to S105 are performed to form each of the first interelectrode layer 43B, the second interelectrode layer 43G, and the third interelectrode layer 43R.

A photosensitive resin material layer, a lower charge transport material layer, a light-emitting material layer, and an upper charge transport material layer are formed on the substrate 42 in steps S101, S102, S103, and S104 respectively. In step S105, the non-lift-off portions of the photosensitive resin material layer, the lower charge transport material layer, the light-emitting material layer, and the upper charge transport material layer are retained without being lifted off, and the lift-off portions of the photosensitive resin material layer, the lower charge transport material layer, the light-emitting material layer, and the upper charge transport material layer are lifted off. Hence, the photosensitive resin material layer, the lower charge transport material layer, the light-emitting material layer, and the upper charge transport material layer are patterned into photosensitive resin layers, lower charge transport layers, light-emitting layers, and upper charge transport layers.

In Embodiment 1, step S102 follows step S101. In addition, step S103 follows step S102. In addition, step S104 follows step S103. In addition, step S105 follows step S104. In addition, in Embodiment 1, both the lower charge transport material layer and the upper charge transport material layer are charge transport material layers formed after the photosensitive resin material layer is formed in step S101.

Figure 5:
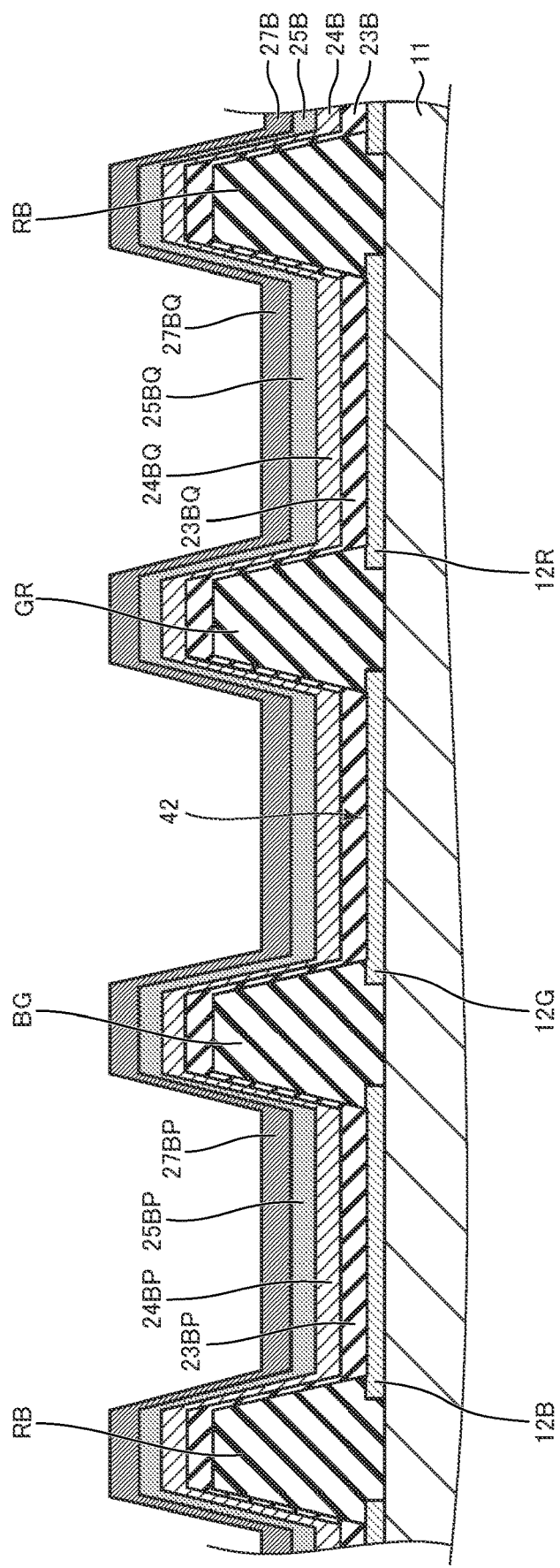
FIG. 5 is a schematic cross-sectional view of an intermediate article obtained in forming a first interelectrode layer in the display device in accordance with Embodiment 1.
Figure 6:
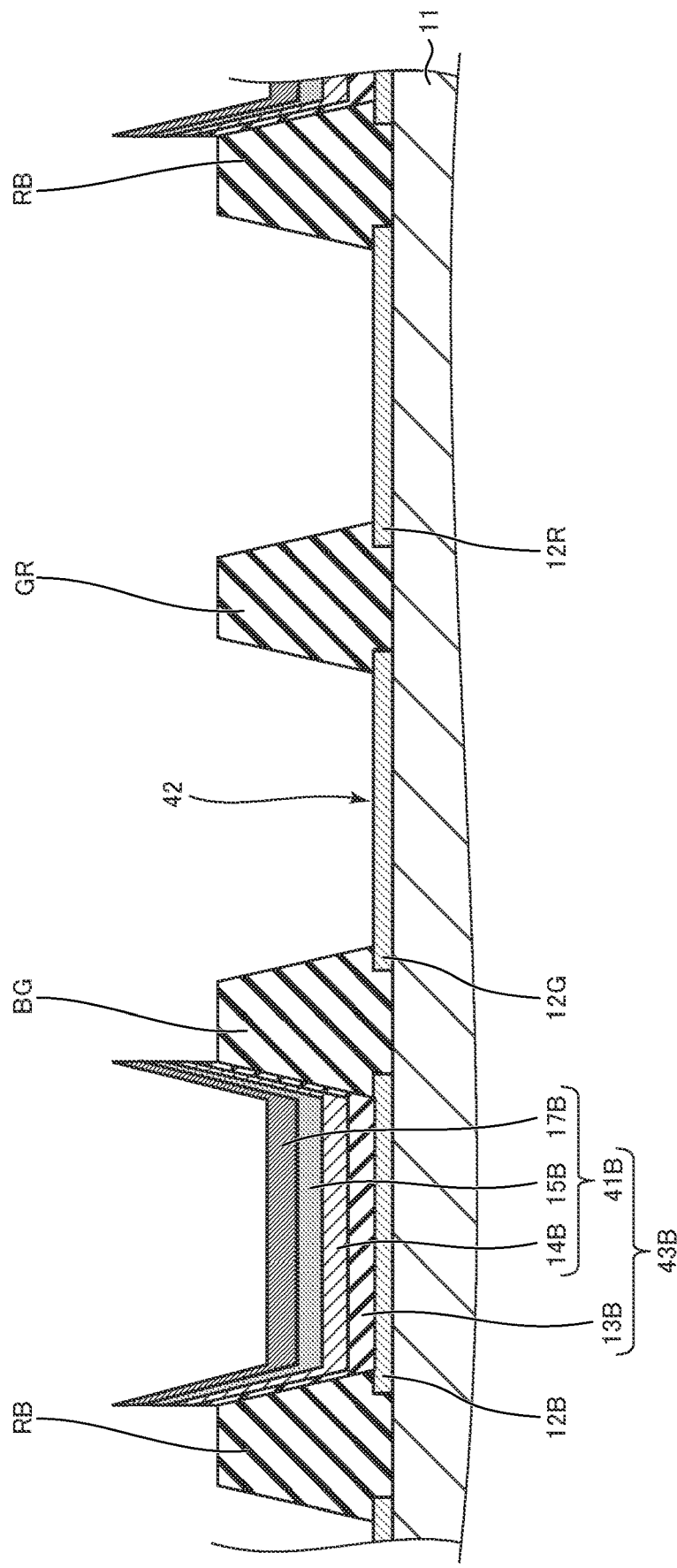
FIG. 6 is a schematic cross-sectional view of an intermediate article obtained in forming the first interelectrode layer in the display device in accordance with Embodiment 1.

FIGS. 5 and 6 are schematic cross-sectional views of an intermediate article obtained in forming the first interelectrode layer 43B in the display device 1 in accordance with Embodiment 1.

To form the first interelectrode layer 43B, steps S101 to S105 are performed with a first photosensitive resin material layer 23B, a lower, first charge transport material layer 24B, a first light-emitting material layer 25B, and an upper, first charge transport material layer 27B, all shown in FIG. 5, as the photosensitive resin material layer, the lower charge transport material layer, the light-emitting material layer, and the upper charge transport material layer respectively. Hence, the first photosensitive resin layer 13B, the lower, first charge transport layer 14B, the first light-emitting layer 15B, and the upper, first charge transport layer 17B, all shown in FIG. 6, are formed as the photosensitive resin layer, the lower charge transport layer, the light-emitting layer, and the upper charge transport layer respectively.

The lower, first charge transport material layer 24B, the first light-emitting material layer 25B, and the upper, first charge transport material layer 27B are each formed with the first pixel electrode 12B as an electrode and the second pixel electrode 12G and the third pixel electrode 12R as another electrode so that the entire region where each layer overlaps these electrodes overlaps the first photosensitive resin material layer 23B. Hence, the lower, first charge transport layer 14B, the first light-emitting layer 15B, and the upper, first charge transport layer 17B, which overlap the first pixel electrode 12B and the first photosensitive resin layer 13B, can be obtained from the lower, first charge transport material layer 24B, the first light-emitting material layer 25B and the upper, first charge transport material layer 27B respectively.

The lower, first charge transport material layer 24B, the first light-emitting material layer 25B, and the upper, first charge transport material layer 27B are each provided on across the first pixel electrode 12B, the second pixel electrode 12G, the third pixel electrode 12R, the first bank BG, the second bank GR, and the third bank RB. Therefore, each layer dos not need to be patterned.

A non-lift-off portion 23BP of the first photosensitive resin material layer 23B, a non-lift-off portion 24BP of the lower, first charge transport material layer 24B, a non-lift-off portion 25B of the first light-emitting material layer 25B, and a non-lift-off portion 27BP of the upper, first charge transport material layer 27B are formed at least on a part of the first pixel electrode 12B. A lift-off portion 23BQ of the first photosensitive resin material layer 23B, a lift-off portion 24BQ of the lower, first charge transport material layer 24B, a lift-off portion 25BQ of the first light-emitting material layer 25B, and a lift-off portion 27BQ of the upper, first charge transport material layer 27B are formed at least on a part of the second pixel electrode 12G and the third pixel electrode 12R.

To lift off the lift-off portion 23BQ, the lift-off portion 24BQ, the lift-off portion 25BQ, and the lift-off portion 27BQ, the first photosensitive resin material layer 23B is exposed to light and developed using a photomask. When the first photosensitive resin material layer 23B contains a positive photosensitive resin, the lift-off portion 23BQ is exposed to light, the non-lift-off portion 23BP is not exposed to light, and the exposed lift-off portion 23BQ is removed by development. When the first photosensitive resin material layer 23B contains a negative photosensitive resin, the non-lift-off portion 23BP is exposed to light, the lift-off portion 23BQ is not exposed to light, and the non-exposed lift-off portion 23BQ is removed by development.

Figure 7:
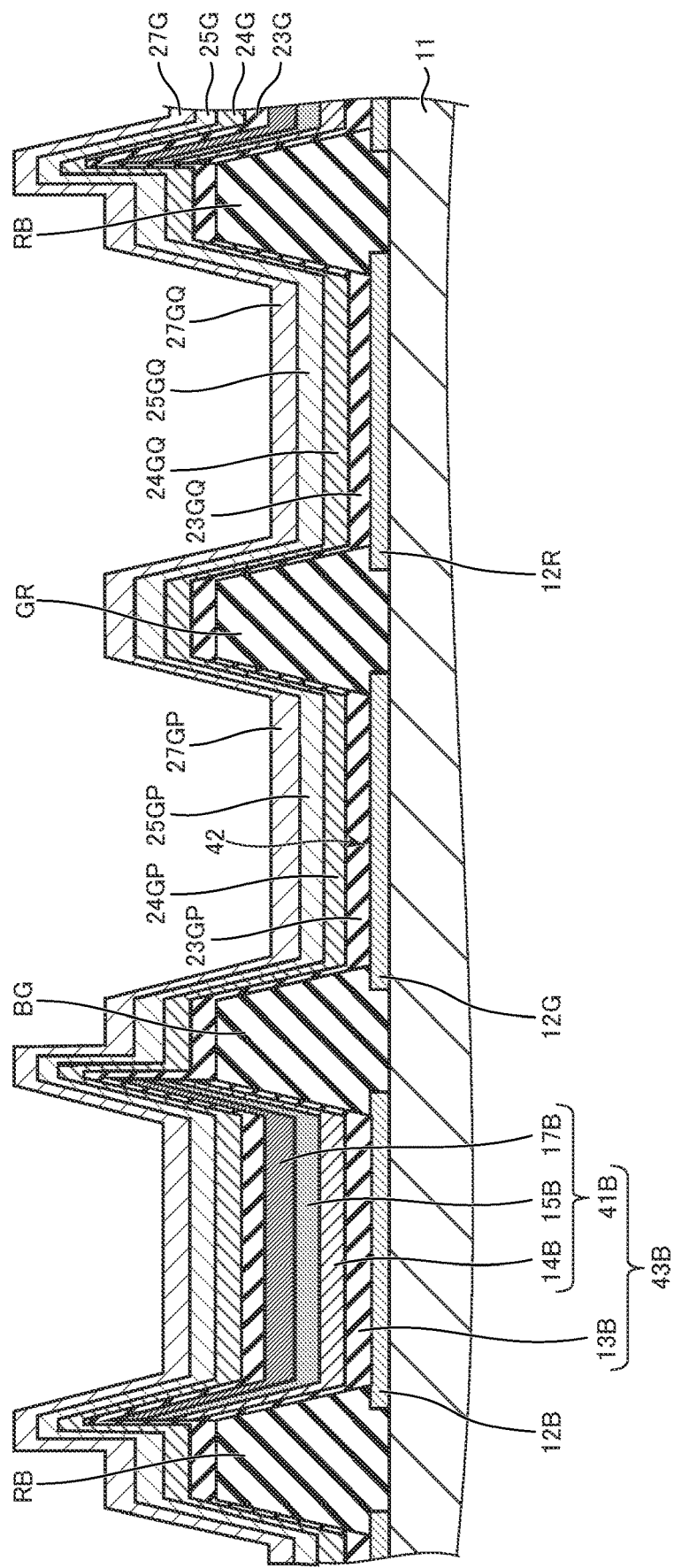
FIG. 7 is a schematic cross-sectional view of an intermediate article obtained in forming a second interelectrode layer in the display device in accordance with Embodiment 1.
Figure 8:
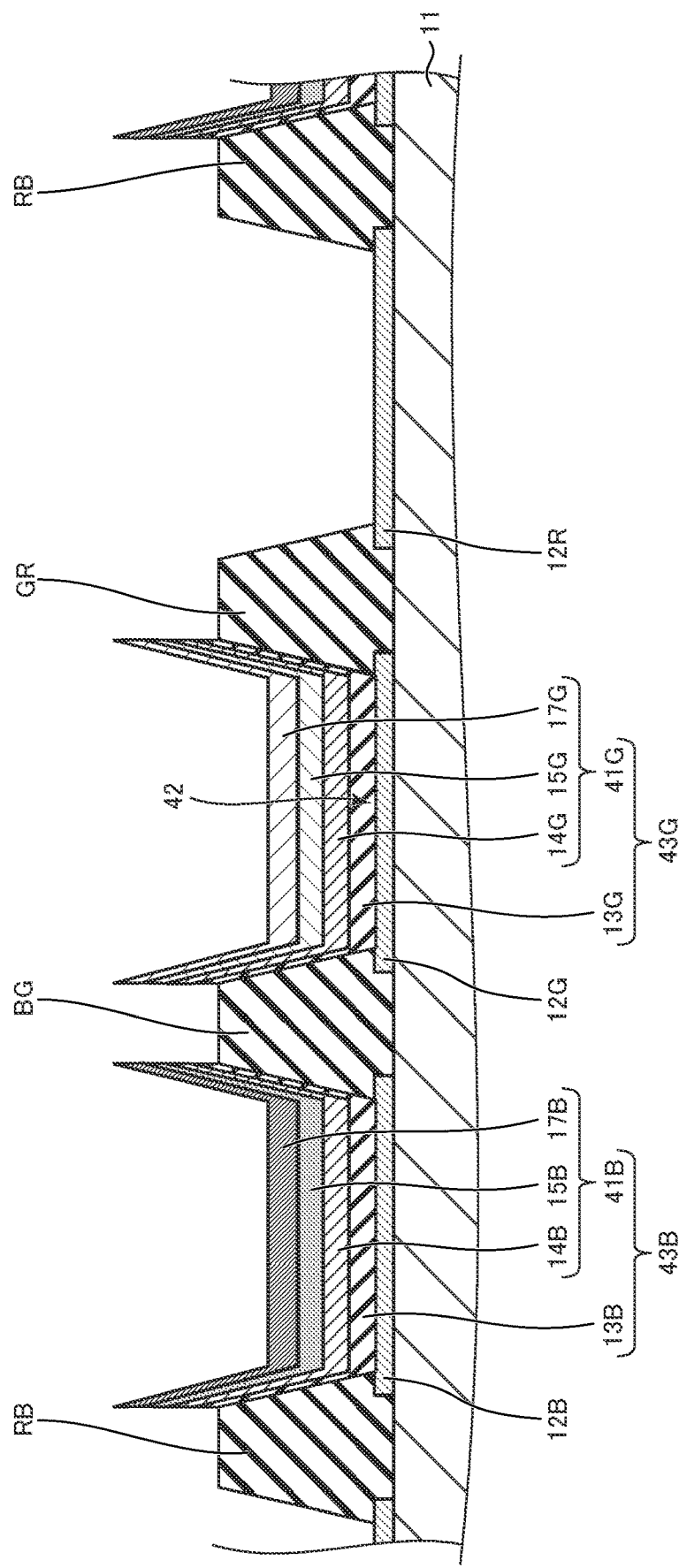
FIG. 8 is a schematic cross-sectional view of an intermediate article obtained in forming the second interelectrode layer in the display device in accordance with Embodiment 1.

FIGS. 7 and 8 are schematic cross-sectional views of an intermediate article obtained in forming the second interelectrode layer 43G in the display device 1 in accordance with Embodiment 1.

To form the second interelectrode layer 43G, steps S101 to S105 are performed with a second photosensitive resin material layer 23G, a lower, second charge transport material layer 24G, a second light-emitting material layer 25G, and an upper, second charge transport material layer 27G, all shown in FIG. 7, as the photosensitive resin material layer, the lower charge transport material layer, the light-emitting material layer, and the upper charge transport material layer respectively. Hence, the second photosensitive resin layer 13G, the lower, second charge transport layer 14G, the second light-emitting layer 15G, and the upper, second charge transport layer 17G, all shown in FIG. 8, are formed as the photosensitive resin layer, the lower charge transport layer, the light-emitting layer, and the upper charge transport layer respectively.

The lower, second charge transport material layer 24G, the second light-emitting material layer 25G, and the upper, second charge transport material layer 27G are each formed with the second pixel electrode 12G as an electrode and the first pixel electrode 12B and the third pixel electrode 12R as another electrode so that the entire region where each layer overlaps these electrodes overlaps the second photosensitive resin material layer 23G. Hence, the lower, second charge transport layer 14G, the second light-emitting layer 15G, and the upper, second charge transport layer 17G, which overlap the second pixel electrode 12G and the second photosensitive resin layer 13G, can be obtained from the lower, second charge transport material layer 24G, the second light-emitting material layer 25G, and the upper, second charge transport material layer 27G respectively.

The lower, second charge transport material layer 24G, the second light-emitting material layer 25G, and the upper, second charge transport material layer 27G are each provided on across the first pixel electrode 12B, the second pixel electrode 12G, the third pixel electrode 12R, the first bank BG, the second bank GR, and the third bank RB. Therefore, each layer dos not need to be patterned.

A non-lift-off portion 23GP of the second photosensitive resin material layer 23G, a non-lift-off portion 24GP of the lower, second charge transport material layer 24G, a non-lift-off portion 25GP of the second light-emitting material layer 25G, and a non-lift-off portion 27GP of the upper, second charge transport material layer 27G are formed at least on a part of the second pixel electrode 12G. A lift-off portion 23GQ of the second photosensitive resin material layer 23G, a lift-off portion 24GQ of the lower, second charge transport material layer 24G, a lift-off portion 25GQ of the second light-emitting material layer 25G, and a lift-off portion 27GQ of the upper, second charge transport material layer 27G are formed at least on a part of the first pixel electrode 12B and the third pixel electrode 12R.

To lift off the lift-off portion 23GQ, the lift-off portion 24GQ, the lift-off portion 25GQ, and the lift-off portion 27GQ, the second photosensitive resin material layer 23G is exposed to light and developed using a photomask. When the second photosensitive resin material layer 23G contains a positive photosensitive resin, the lift-off portion 23GQ is exposed to light, the non-lift-off portion 23GP is not exposed to light, and the exposed lift-off portion 23GQ is removed by development. When the second photosensitive resin material layer 23G contains a negative photosensitive resin, the non-lift-off portion 23GP is exposed to light, the lift-off portion 23GQ is not exposed to light, and the non-exposed lift-off portion 23GQ is removed by development.

Figure 9:
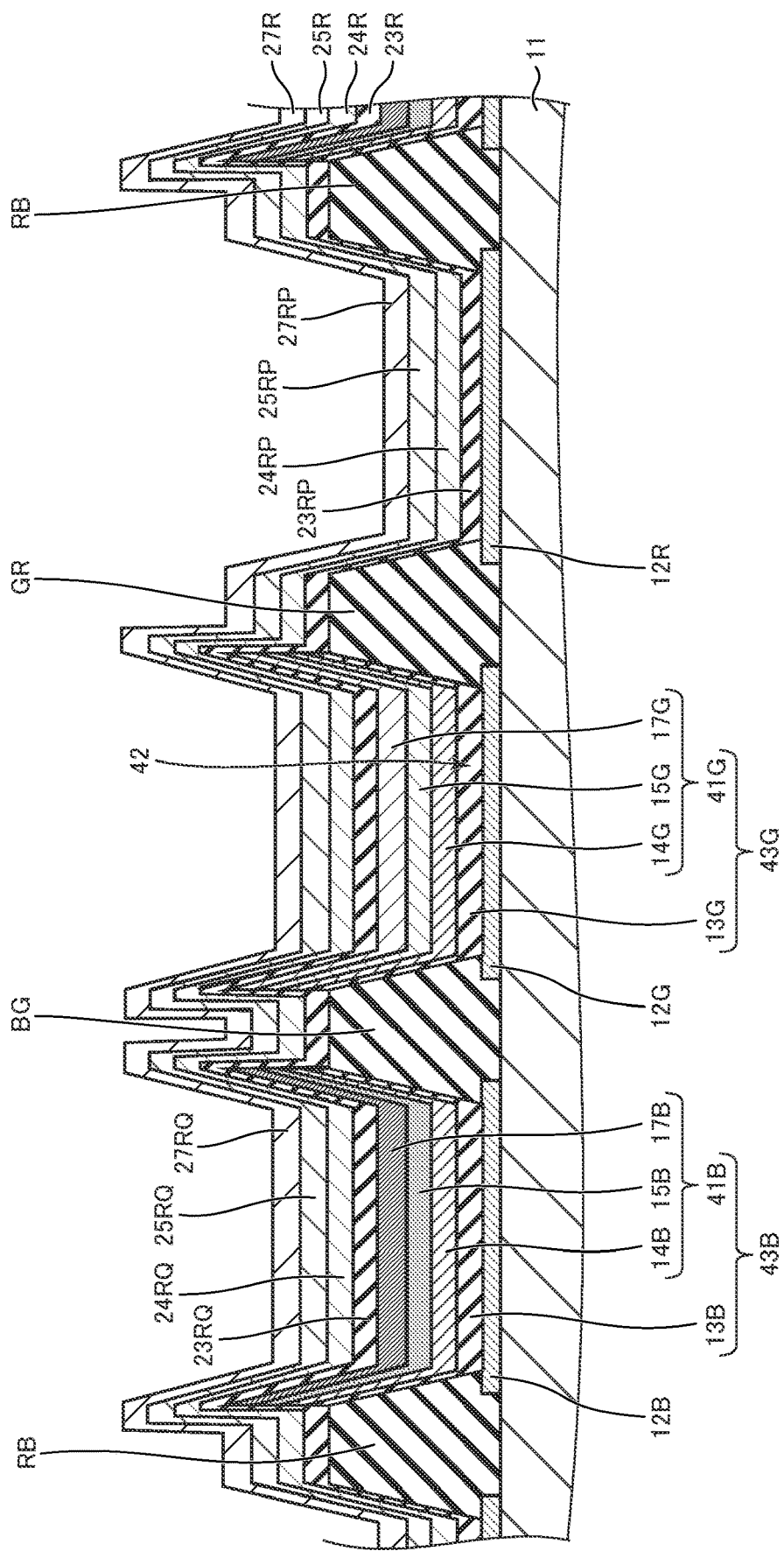
FIG. 9 is a schematic cross-sectional view of an intermediate article obtained in forming a third interelectrode layer in the display device in accordance with Embodiment 1.
Figure 10:
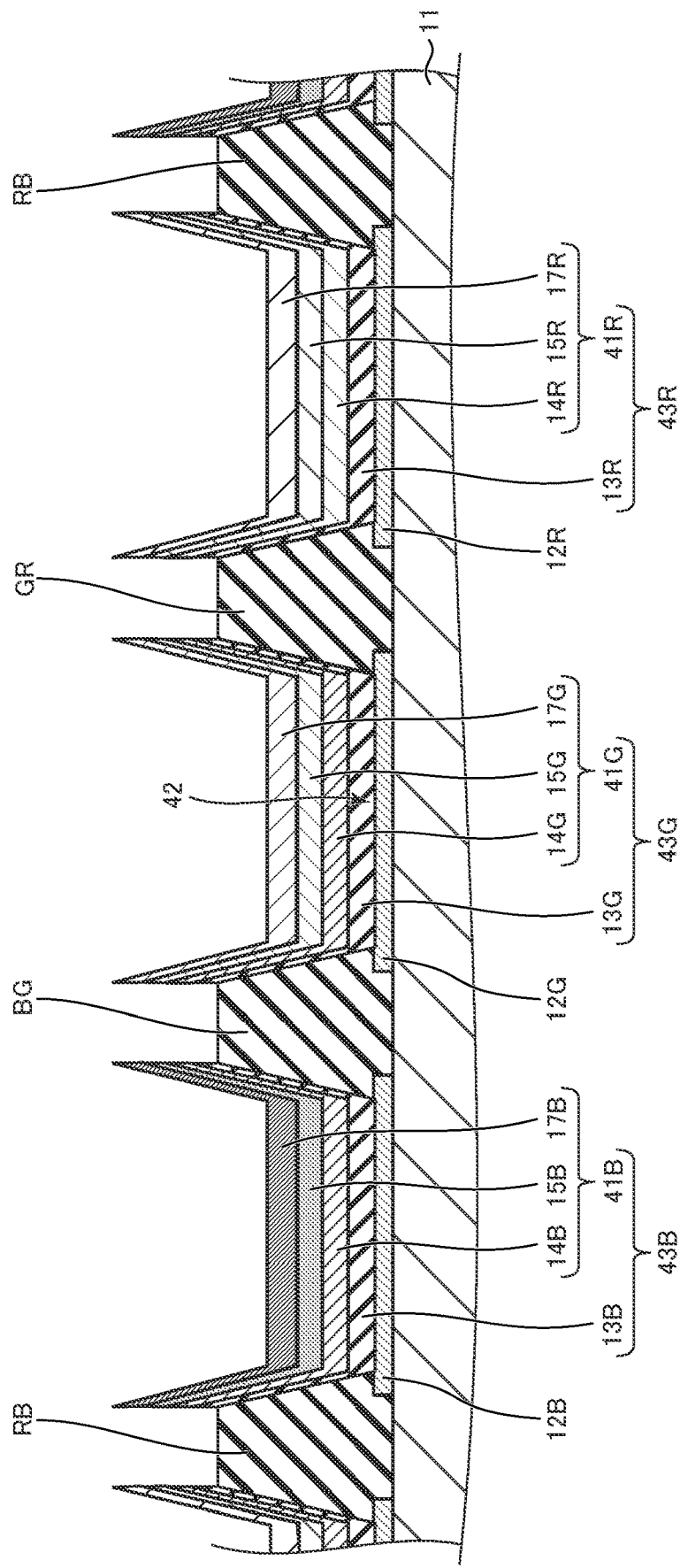
FIG. 10 is a schematic cross-sectional view of an intermediate article obtained in forming the third interelectrode layer in the display device in accordance with Embodiment 1.

FIGS. 9 and 10 are schematic cross-sectional views of an intermediate article obtained in forming the third interelectrode layer 43R in the display device 1 in accordance with Embodiment 1.

To form the third interelectrode layer 43R, steps S101 to S105 are performed with a third photosensitive resin material layer 23R, a lower, third charge transport material layer 24R, a third light-emitting material layer 25R, and an upper, third charge transport material layer 27R, all shown in FIG. 9, as the photosensitive resin material layer, the lower charge transport material layer, the light-emitting material layer, and the upper charge transport material layer respectively. Hence, the third photosensitive resin layer 13R, the lower, third charge transport layer 14R, the third light-emitting layer 15R, and the upper, third charge transport layer 17R, all shown in FIG. 10, are formed as the photosensitive resin layer, the lower charge transport layer, the light-emitting layer, and the upper charge transport layer respectively.

The lower, third charge transport material layer 24R, the third light-emitting material layer 25R, and the upper, third charge transport material layer 27R are each formed with the third pixel electrode 12R as an electrode and the first pixel electrode 12B and the second pixel electrode 12G as another electrode so that the entire region where each layer overlaps these electrodes overlaps the third photosensitive resin material layer 23R. Hence, the lower, third charge transport layer 14R, the third light-emitting layer 15R, and the upper, third charge transport layer 17R, which overlap the third pixel electrode 12R and the third photosensitive resin layer 13R, can be obtained from the lower, third charge transport material layer 24R, the third light-emitting material layer 25R, and the upper, third charge transport material layer 27R respectively.

The lower, third charge transport material layer 24R, the third light-emitting material layer 25R, and the upper, third charge transport material layer 27R are each provided on across the first pixel electrode 12B, the second pixel electrode 12G, the third pixel electrode 12R, the first bank BG, the second bank GR, and the third bank RB. Therefore, each layer dos not need to be patterned.

A non-lift-off portion 23RP of the third photosensitive resin material layer 23R, a non-lift-off portion 24RP of the lower, third charge transport material layer 24R, a non-lift-off portion of the third light-emitting material layer 25R, and a non-lift-off portion 27RP of the upper, third charge transport material layer 27R are formed at least on a part of the third pixel electrode 12R. A lift-off portion 23RQ of the third photosensitive resin material layer 23R, a lift-off portion 24RQ of the lower, third charge transport material layer 24R, a lift-off portion 25RQ of the third light-emitting material layer 25R, and a lift-off portion 27RQ of the upper, third charge transport material layer 27R are formed at least on a part of the first pixel electrode 12B and the second pixel electrode 12G.

To lift off the lift-off portion 23RQ, the lift-off portion 24RQ, the lift-off portion 25RQ, and the lift-off portion 27RQ, the third photosensitive resin material layer 23R is exposed to light and developed using a photomask. When the third photosensitive resin material layer 23R contains a positive photosensitive resin, the lift-off portion 23RQ is exposed to light, the non-lift-off portion 23RP is not exposed to light, and the exposed lift-off portion 23RQ is removed by development. When the third photosensitive resin material layer 23R contains a negative photosensitive resin, the non-lift-off portion 23RP is exposed to light, the lift-off portion 23RQ is not exposed to light, and the non-exposed lift-off portion 23RQ is removed by development.

The photomasks used in forming the first interelectrode layer 43B, the second interelectrode layer 43G, and the third interelectrode layer 43R may be mutually different photomasks or the same photomask. If the photomasks used in forming the first interelectrode layer 43B, the second interelectrode layer 43G, and the third interelectrode layer 43R are the same photomask, the same photomask is used by changing the location.

1.8 Effects of Embodiment 1

The first photosensitive resin material layer 23B, the lower, first charge transport material layer 24B, the first light-emitting material layer 25B, the upper, first charge transport material layer 27B, the second photosensitive resin material layer 23G, the lower, second charge transport material layer 24G, the second light-emitting material layer 25G, the upper, second charge transport material layer 27G, the third photosensitive resin material layer 23R, the lower, third charge transport material layer 24R, the third light-emitting material layer 25R, and the upper, third charge transport material layer 27R are not patterned when these layers are formed, but patterned by lift-off after these layers are formed. Therefore, these layers can be formed by a solution process.

If these layers are formed by a vacuum process such as vapor deposition, the cost of the formation of the layers is high. In contrast, if these layers are formed by a solution process, the cost of the formation of the layers is low. In addition, the process of forming the layers can be shortened.

If these layers are patterned by inkjet technology to form the layers, high resolutions are difficult to achieve. In contrast, if these layers are patterned by lift-off after the layers are formed, high resolutions are easy to achieve.

The lower, first charge transport material layer 24B, the first light-emitting material layer 25B, the upper, first charge transport material layer 27B, the lower, second charge transport material layer 24G, the second light-emitting material layer 25G, the upper, second charge transport material layer 27G, the lower, third charge transport material layer 24R, the third light-emitting material layer 25R, and the upper, third charge transport material layer 27R are patterned by lift-off after the layers are formed. This eliminates the need for etching and ashing, thereby simplifying the manufacture of the display device 1.

The lower, first charge transport material layer 24B, the first light-emitting material layer 25B, and the upper, first charge transport material layer 27B are simultaneously patterned by lift-off, the lower, second charge transport material layer 24G, the second light-emitting material layer and the upper, second charge transport material layer 27G are simultaneously patterned by lift-off, and the lower, third charge transport material layer 24R, the third light-emitting material layer 25R, and the upper, third charge transport material layer 27R are simultaneously patterned by lift-off. This enables simplifying the manufacture of the display device 1.

The display device 1 is a differently colored element in which functional layers have different colors.

Therefore, the first functional layer 41B, the second functional layer 41G, and the third functional layer 41R are independent from each other. Hence, the first functional layer 41B, the second functional layer 41G, and the third functional layer 41R may differ from each other, for example, in number and can be adjusted, for example, in number to suit to the first light-emitting element B, the second light-emitting element G, and the third light-emitting element R respectively. That can improve the luminescence properties of the first light-emitting element B, the second light-emitting element G, and the third light-emitting element R. For instance, the first light-emitting element B, the second light-emitting element G, and the third light-emitting element R can exhibit improved luminous efficiency. In addition, the first functional layer 41B, the second functional layer 41G, and the third functional layer 41R can be restrained from interfering with each other. For instance, the occurrence of leaks, color mixing, and scattering between the first functional layer 41B, the second functional layer 41G, and the third functional layer 41R can be restrained.

In addition, the lower, first charge transport layer 14B, the lower, second charge transport layer 14G, and the lower, third charge transport layer 14R are independent from each other. In addition, the first light-emitting layer 15B, the second light-emitting layer 15G, and the third light-emitting layer 15R are independent from each other. In addition, the upper, first charge transport layer 17B, the upper, second charge transport layer 17G, and the upper, third charge transport layer 17R are independent from each other. For these reasons, the lower, first charge transport layer 14B, the first light-emitting layer 15B, and the upper, first charge transport layer 17B may be adjusted, for example, in composition and/or thickness to suit to the first light-emitting element B. That can improve the luminescence properties of the first light-emitting element B. For instance, the first light-emitting element B can exhibit improved luminous efficiency. In addition, the lower, second charge transport layer 14G, the second light-emitting layer 15G, and the upper, second charge transport layer 17G may be adjusted, for example, in composition and/or thickness to suit to the second light-emitting element G. That can improve the luminescence properties of the second light-emitting element G. For instance, the second light-emitting element G can exhibit improved luminous efficiency. In addition, the lower, third charge transport layer 14R, the third light-emitting layer 15R, and the upper, third charge transport layer 17R may be adjusted, for example, in composition and/or thickness to suit to the third light-emitting element R. That can improve the luminescence properties of the third light-emitting element R. For instance, the third light-emitting element R can exhibit improved luminous efficiency.

As an example, PCT International Application Publication No. WO2020/049742 discloses a technique (QDpr scheme) of patterning a light-emitting layer by forming a layer of a mixture of quantum dots and a photosensitive material across the entire face and exposing and developing the formed layer for patterning. However, the QDpr scheme is not capable of patterning a layer other than the quantum-dot layer.

2 Embodiment 2

The following will describe differences between Embodiment 1 and Embodiment 2. The description may be silent about some structures and features that are common to Embodiment 1 and Embodiment 2.

Figure 11:
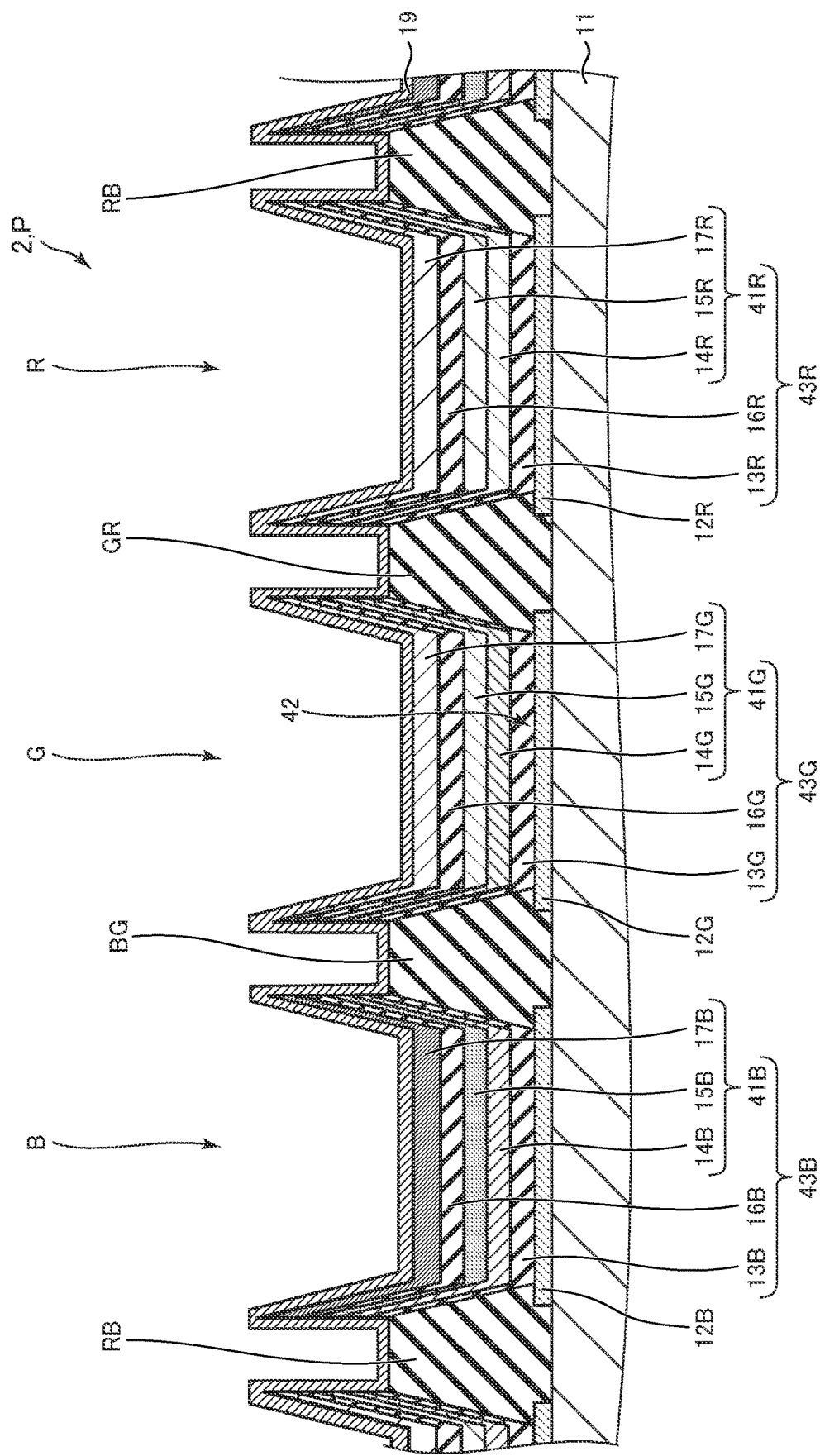
FIG. 11 is a schematic cross-sectional view of each pixel in a display device in accordance with Embodiment 2.

FIG. 11 is a schematic cross-sectional view of each pixel P in a display device 2 in accordance with Embodiment 2.

Referring to FIG. 11, each pixel P, similarly to Embodiment 1, includes a substrate 11, a first pixel electrode 12B, a second pixel electrode 12G, a third pixel electrode 12R, a first photosensitive resin layer 13B, a second photosensitive resin layer 13G, a third photosensitive resin layer 13R, a lower, first charge transport layer 14B, a lower, second charge transport layer 14G, a lower, third charge transport layer 14R, a first light-emitting layer 15B, a second light-emitting layer 15G, a third light-emitting layer 15R, an upper, first charge transport layer 17B, an upper, second charge transport layer 17G, an upper, third charge transport layer 17R, and a common electrode 19. In addition, each pixel P includes another, first photosensitive resin layer 16B, another, second photosensitive resin layer 16G, and another, third photosensitive resin layer 16R.

The other, first photosensitive resin layer 16B, the other, second photosensitive resin layer 16G, and the other, third photosensitive resin layer 16R are provided in the first light-emitting element B, the second light-emitting element G, and the third light-emitting element R respectively.

The other, first photosensitive resin layer 16B, the other, second photosensitive resin layer 16G, and the other, third photosensitive resin layer 16R are disposed on the substrate 11.

The other, first photosensitive resin layer 16B, the other, second photosensitive resin layer 16G, and the other, third photosensitive resin layer 16R are disposed on the first light-emitting layer 15B, the second light-emitting layer 15G, and third light-emitting layer 15R respectively and disposed below the upper, first charge transport layer 17B, the upper, second charge transport layer 17G, and the upper, third charge transport layer 17R respectively.

Figure 12:
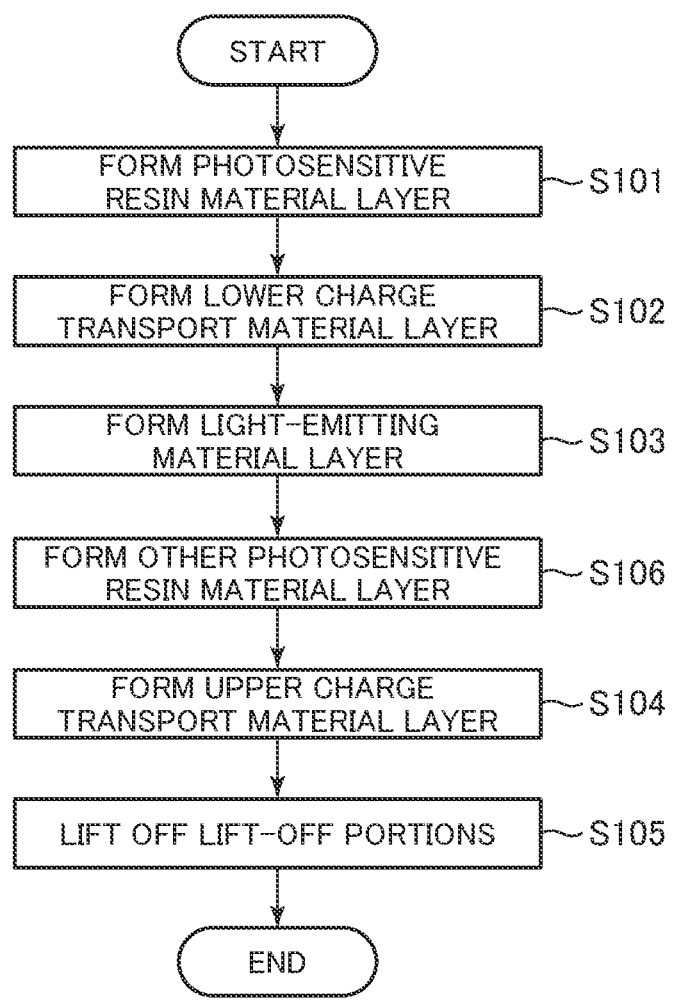
FIG. 12 is a flow chart representing a formation flow for each interelectrode layer in the display device in accordance with Embodiment 2.

FIG. 12 is a flow chart representing a formation flow for each interelectrode layer in the display device 2 in accordance with Embodiment 2.

Referring to FIG. 12, similarly to Embodiment 1, steps S101 to S105 are performed to form each of the first interelectrode layer 43B, the second interelectrode layer 43G, and the third interelectrode layer 43R. In addition, to form each interelectrode layer, step S106 is also performed.

Another photosensitive resin material layer is formed on the substrate 42 in step S106, which follows steps S101, S102, and S103 and precedes steps S104 and S105. In step S105, when lift-off portions are lifted off, the non-lift-off portions of the other photosensitive resin material layer are retained without being lifted off, and the lift-off portions of the other photosensitive resin material layer are lifted off. Hence, the photosensitive resin material layer is patterned into a photosensitive resin layer.

Both the lower charge transport material layer and the upper charge transport material layer are charge transport material layers formed after the photosensitive resin material layer is formed in step S101, again in Embodiment 2.

Figure 13:
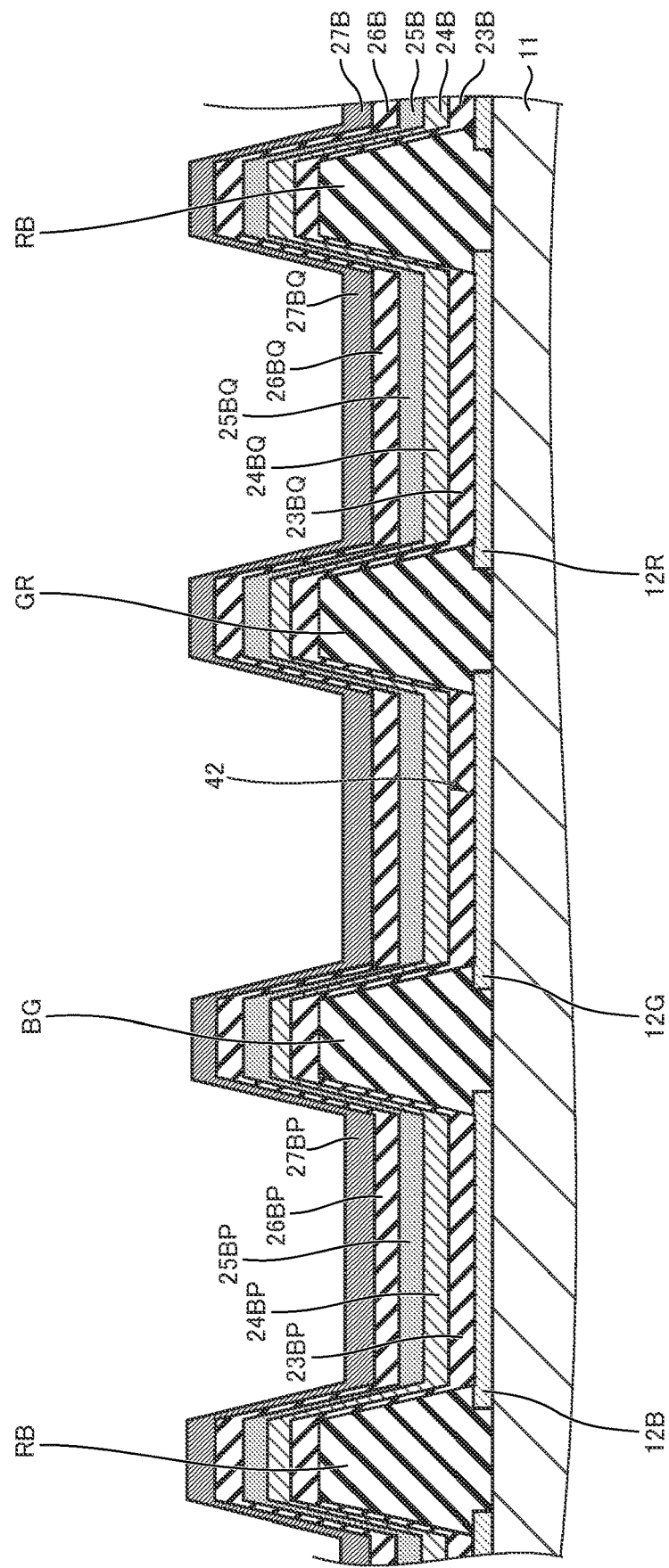
FIG. 13 is a schematic cross-sectional view of an intermediate article obtained in forming a first interelectrode layer in the display device in accordance with Embodiment 2.
Figure 14:
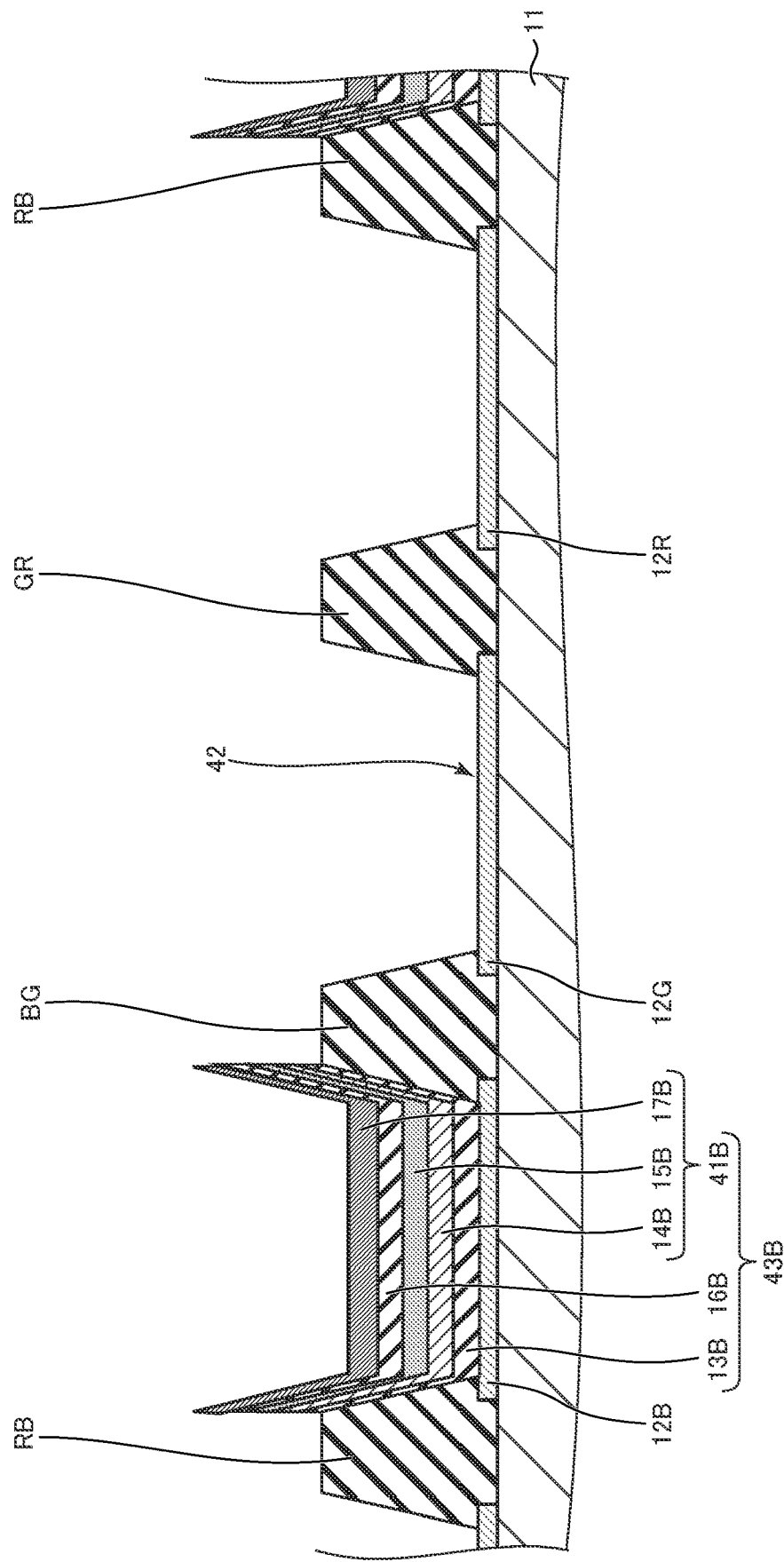
FIG. 14 is a schematic cross-sectional view of an intermediate article obtained in forming the first interelectrode layer in the display device in accordance with Embodiment 2.

FIGS. 13 and 14 are schematic cross-sectional views of an intermediate article obtained in forming the first interelectrode layer 43B in the display device 2 in accordance with Embodiment 2.

To form the first interelectrode layer 43B, steps S101 to S106 are performed with another, first photosensitive resin material layer 26B shown in FIG. 13 as the other photosensitive resin material layer. Hence, the other, first photosensitive resin layer 16B shown in FIG. 14 is obtained as another photosensitive resin layer.

The other, first photosensitive resin material layer 26B is formed with the first pixel electrode 12B as an electrode and the second pixel electrode 12G and the third pixel electrode 12R as another electrode so that the entire region where the other, first photosensitive resin material layer 26B overlaps these electrodes overlaps the first photosensitive resin material layer 23B. Hence, the other, first photosensitive resin layer 16B, which overlaps the first pixel electrode 12B and the first photosensitive resin layer 13B, can be obtained from the other, first photosensitive resin material layer 26B.

The other, first photosensitive resin material layer 26B is provided on across the first pixel electrode 12B, the second pixel electrode 12G, the third pixel electrode 12R, the first bank BG, the second bank GR, and the third bank RB. Therefore, the other, first photosensitive resin material layer 26B dos not need to be patterned.

A non-lift-off portion 26BP of the other, first photosensitive resin material layer 26B is formed at least on a part of the first pixel electrode 12B. A lift-off portion 26BQ of the other, first photosensitive resin material layer 26B is formed at least on a part of the second pixel electrode 12G and the third pixel electrode 12R.

Figure 15:
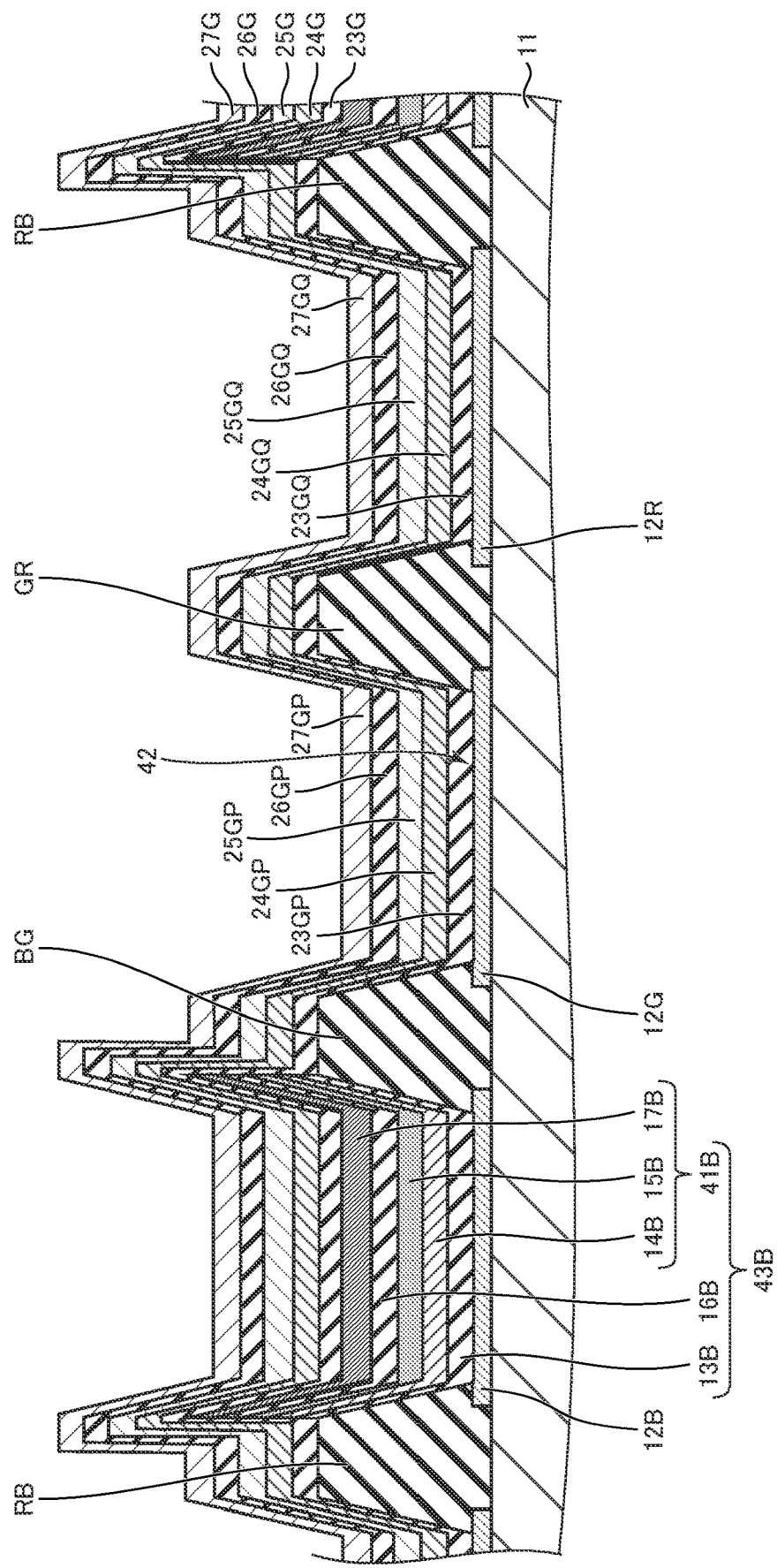
FIG. 15 is a schematic cross-sectional view of an intermediate article obtained in forming a second interelectrode layer in the display device in accordance with Embodiment 2.
Figure 16:
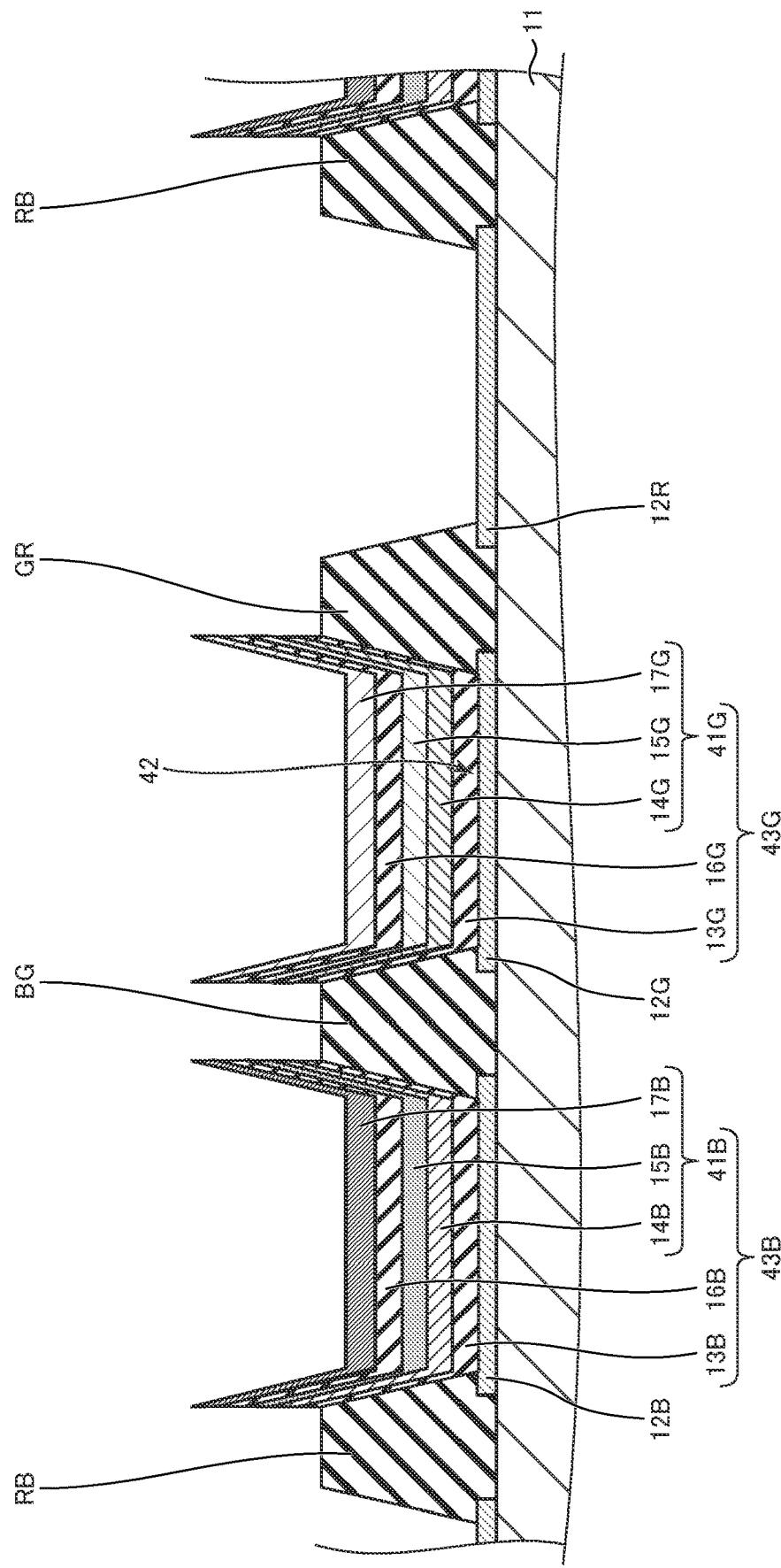
FIG. 16 is a schematic cross-sectional view of an intermediate article obtained in forming the second interelectrode layer in the display device in accordance with Embodiment 2.

FIGS. 15 and 16 are schematic cross-sectional views of an intermediate article obtained in forming the second interelectrode layer 43G in the display device 2 in accordance with Embodiment 2.

To form the second interelectrode layer 43G, steps S101 to S106 are performed with another, second photosensitive resin material layer 26G shown in FIG. 15 as the other photosensitive resin material layer. Hence, the other, second photosensitive resin layer 16G shown in FIG. 16 is obtained as the other photosensitive resin layer.

The other, second photosensitive resin material layer 26G is formed with the second pixel electrode 12G as an electrode and the first pixel electrode 12B and the third pixel electrode 12R as another electrode so that the entire region where the other, second photosensitive resin material layer 26G overlaps these electrodes overlaps the second photosensitive resin material layer 23G. Hence, the other, second photosensitive resin layer 16G, which overlaps the second pixel electrode 12G and the second photosensitive resin layer 13G, can be obtained from the other, second photosensitive resin material layer 26G.

The other, second photosensitive resin material layer 26G is provided on across the first pixel electrode 12B, the second pixel electrode 12G, the third pixel electrode 12R, the first bank BG, the second bank GR, and the third bank RB. Therefore, the other, second photosensitive resin material layer 26G does not need to be patterned.

A non-lift-off portion 26GP of the other, second photosensitive resin material layer 26G is formed at least on a part of the second pixel electrode 12G. A lift-off portion 26GQ of the other, second photosensitive resin material layer 26G is formed at least on a part of the first pixel electrode 12B and the third pixel electrode 12R.

Figure 17:
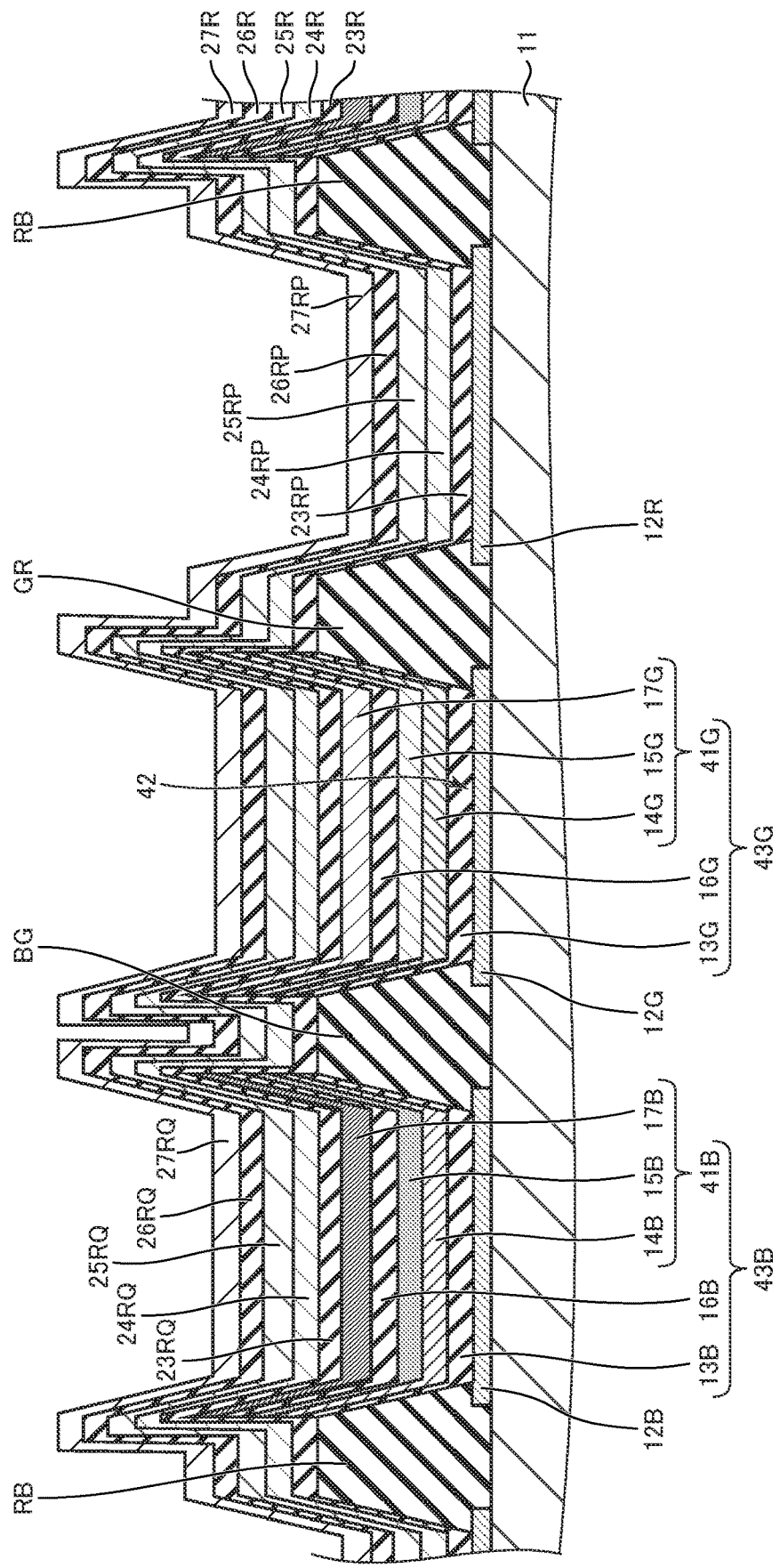
FIG. 17 is a schematic cross-sectional view of an intermediate article obtained in forming a third interelectrode layer in the display device in accordance with Embodiment 2.
Figure 18:
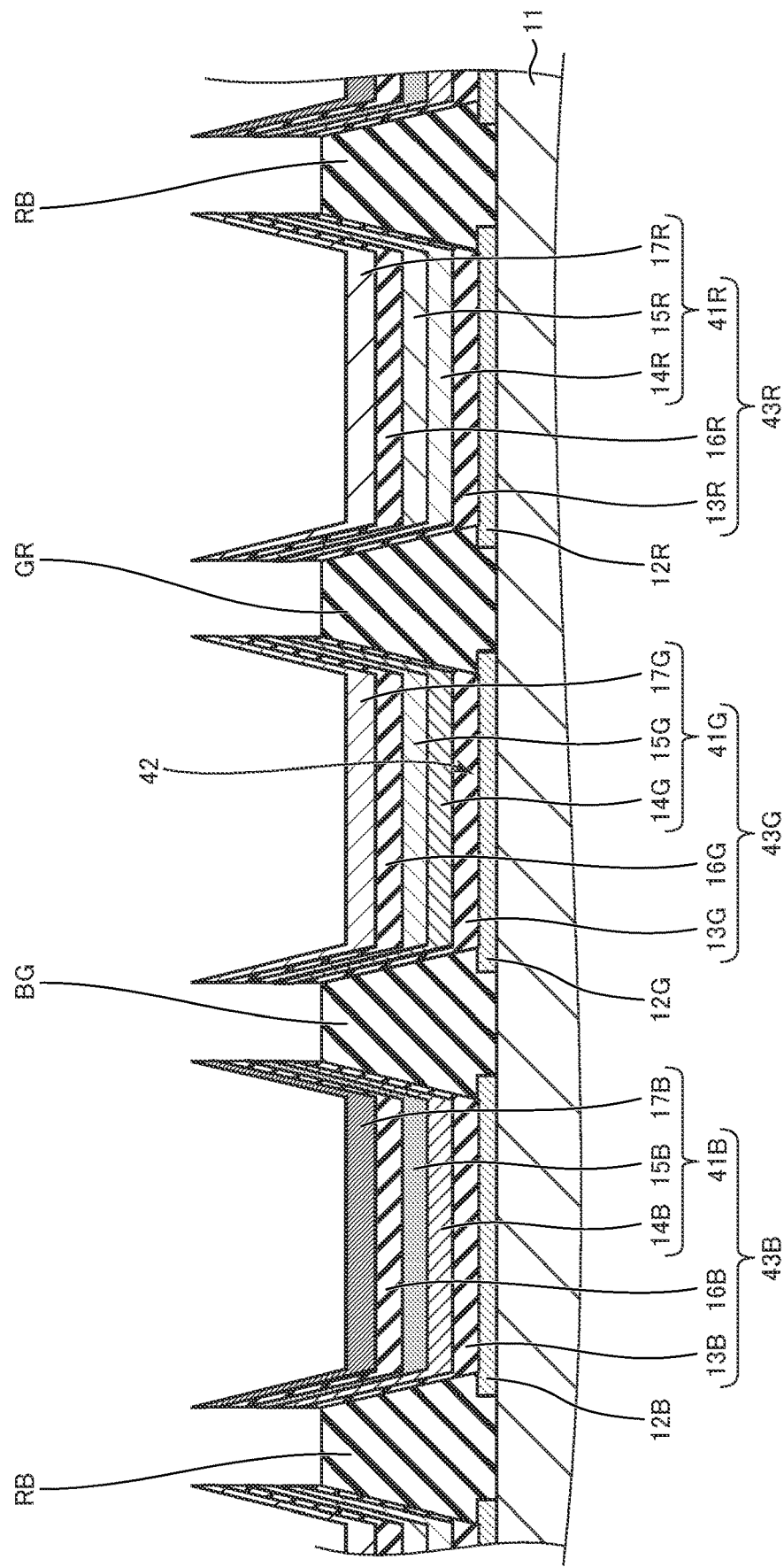
FIG. 18 is a schematic cross-sectional view of an intermediate article obtained in forming the third interelectrode layer in the display device in accordance with Embodiment 2.

FIGS. 17 and 18 are schematic cross-sectional views of an intermediate article obtained in forming the third interelectrode layer 43R in the display device 2 in accordance with Embodiment 2.

To form the third interelectrode layer 43R, steps S101 to S106 are performed with another, third photosensitive resin material layer 26R shown in FIG. 17 as the other photosensitive resin material layer. Hence, the other, third photosensitive resin layer 16R shown in FIG. 18 is obtained as the other photosensitive resin layer.

The other, third photosensitive resin material layer 26R is formed with the third pixel electrode 12R as an electrode and the first pixel electrode 12B and the second pixel electrode 12G as another electrode so that the entire region where the other, third photosensitive resin material layer 26R overlaps these electrodes overlaps the third photosensitive resin material layer 23R. Hence, the other, third photosensitive resin layer 16R, which overlaps the first pixel electrode 12B and the third photosensitive resin layer 13R, can be obtained from the other, third photosensitive resin material layer 26R.

The other, third photosensitive resin material layer 26R is provided on across the first pixel electrode 12B, the second pixel electrode 12G, the third pixel electrode 12R, the first bank BG, the second bank GR, and the third bank RB. Therefore, the other, third photosensitive resin material layer 26R does not need to be patterned.

A non-lift-off portion 26RP of the other, third photosensitive resin material layer 26R is formed at least on a part of the third pixel electrode 12R. A lift-off portion 26RQ of the other, third photosensitive resin material layer 26R is formed at least on a part of the first pixel electrode 12B and the second pixel electrode 12G.

Figure 19:
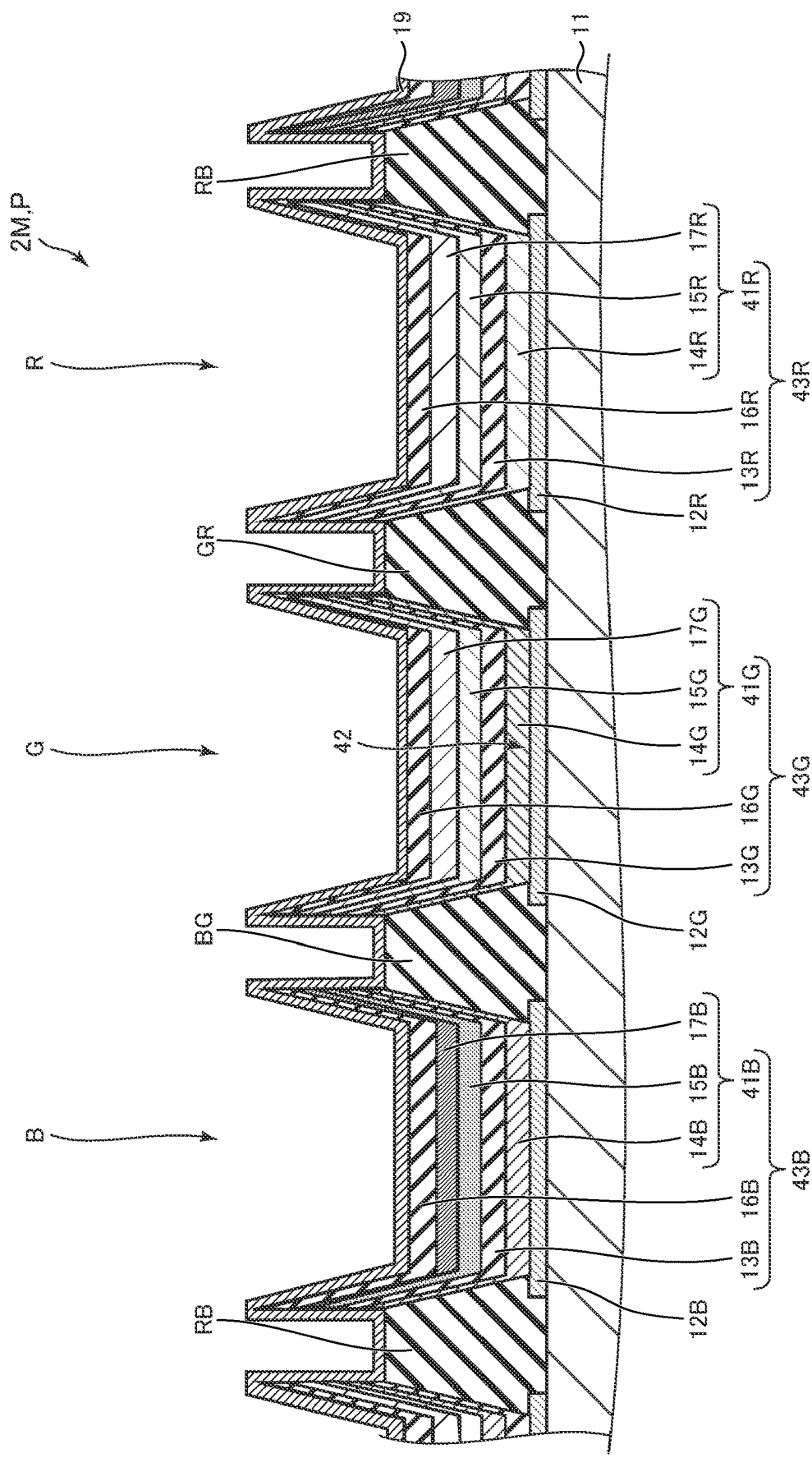
FIG. 19 is a schematic cross-sectional view of each pixel in a display device in accordance with a first variation example of Embodiment 2.

FIG. 19 is a schematic cross-sectional view of each pixel P in a display device 2M in accordance with a first variation example of Embodiment 2.

Referring to FIG. 19, in accordance with the first variation example of Embodiment 2, the first photosensitive resin layer 13B, the second photosensitive resin layer 13G, and the third photosensitive resin layer 13R are disposed on the lower, first charge transport layer 14B, the lower, second charge transport layer 14G, and third charge transport layer 14R respectively and disposed below the first light-emitting layer 15B, the second light-emitting layer 15G, and the third light-emitting layer 15R respectively. In addition, the other, first photosensitive resin layer 16B, the other, second photosensitive resin layer 16G, and the other, third photosensitive resin layer 16R are disposed on the upper, first charge transport layer 17B, the upper, second charge transport layer 17G, and the upper, third charge transport layer 17R respectively and disposed below the common electrode 19.

Figure 20:
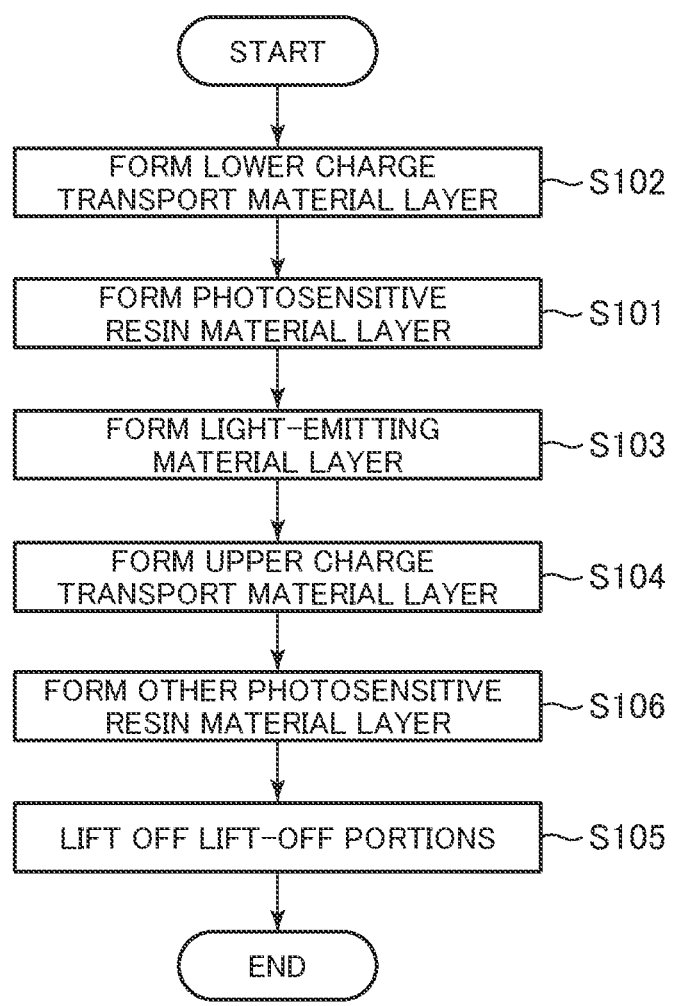
FIG. 20 is a flow chart representing a formation flow for each interelectrode layer in the display device in accordance with the first variation example of Embodiment 2.

FIG. 20 is a flow chart representing a formation flow for each interelectrode layer in the display device 2M in accordance with the first variation example of Embodiment 2.

Referring to FIG. 20, in accordance with the first variation example of Embodiment 2, the lower charge transport material layer is formed in step S102, which follows step S11 and precedes step S101. In addition, the upper charge transport material layer is formed in step S104, which follows step S103 and precedes step S106.

In the first variation example of Embodiment 2, the upper charge transport material layer is the charge transport material layer formed after the photosensitive resin material layer is formed in step S101. In addition, the lower charge transport material layer is the other charge transport material layer formed before the photosensitive resin material layer is formed in step S101.

Figure 21:
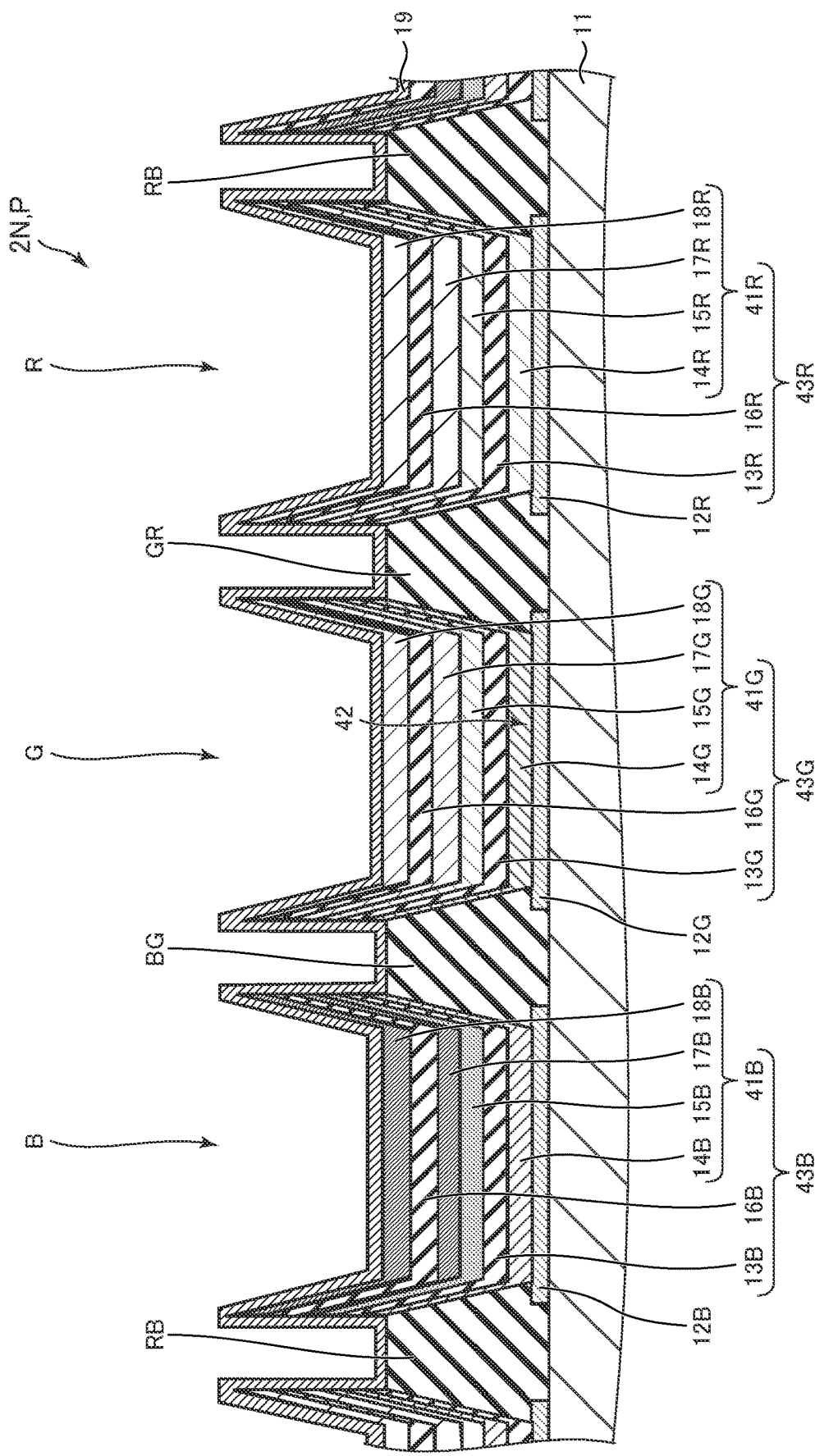
FIG. 21 is a schematic cross-sectional view of each pixel in a display device in accordance with a second variation example of Embodiment 2.

FIG. 21 is a schematic cross-sectional view of each pixel P in a display device 2N in accordance with a second variation example of Embodiment 2.

Referring to FIG. 21, in accordance with the second variation example of Embodiment 2, the display device 2N further includes an upper, first charge transport layer 18B, an upper, second charge transport layer 18G, and an upper, third charge transport layer 18R. The upper, first charge transport layer 18B, the upper, second charge transport layer 18G, and the upper, third charge transport layer 18R are disposed on the other, first photosensitive resin layer 16B, the other, second photosensitive resin layer 16G, and the other, third photosensitive resin layer 16R respectively and disposed below the common electrode 19.

Figure 22:
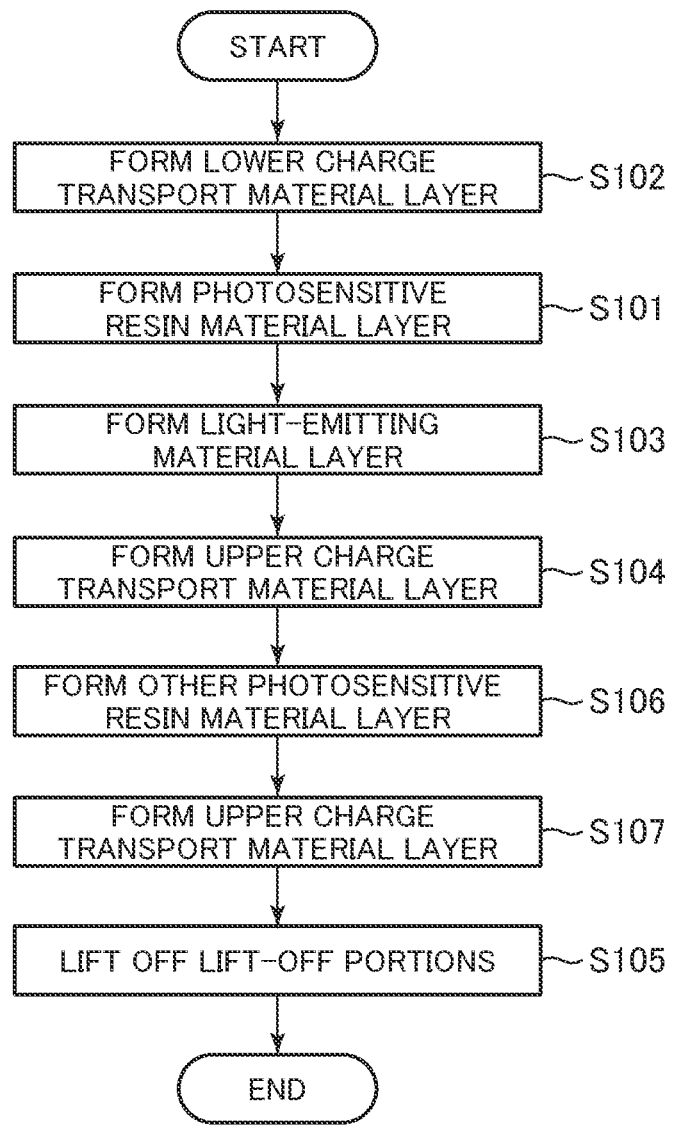
FIG. 22 is a flow chart representing a formation flow for each interelectrode layer in the display device in accordance with the second variation example of Embodiment 2.

FIG. 22 is a flow chart representing a formation flow for each interelectrode layer in the display device 2N in accordance with the second variation example of Embodiment 2.

Referring to FIG. 22, in accordance with the second variation example of Embodiment 2, the upper charge transport material layer is further formed in step S107, which follows step S106 and precedes step S105.

In step S105, when lift-off portions are lifted off, the non-lift-off portions of the upper charge transport material layer formed in step S107 are retained without being lifted off, and the lift-off portions of this upper charge transport material layer are lifted off.

Embodiment 2, the first variation example of Embodiment 2, and the second variation example of Embodiment 2 have similar effects to Embodiment 1.

In addition, in Embodiment 2, the lower, first charge transport layer 14B and the first light-emitting layer 15B, which are formed below the other, first photosensitive resin layer 16B, can be protected by the other, first photosensitive resin layer 16B. In addition, the lower, second charge transport layer 14G and the second light-emitting layer 15G, which are formed below the other, second photosensitive resin layer 16G, can be protected by the other, second photosensitive resin layer 16G. In addition, the lower, third charge transport layer 14R and the third light-emitting layer 15R, which are formed below the other, third photosensitive resin layer 16R, can be protected by the other, third photosensitive resin layer 16R. Hence, the lower, first charge transport layer 14B, the first light-emitting layer 15B, the lower, second charge transport layer 14G, the second light-emitting layer 15G, the lower, third charge transport layer 14R, and the third light-emitting layer 15R can be restrained from being damaged during the manufacture of the display device 2, especially during the development.

In the first variation example and the second variation example of Embodiment 2, the lower, first charge transport layer 14B, which is formed below the first photosensitive resin layer 13B, can be protected by the first photosensitive resin layer 13B. In addition, the lower, second charge transport layer 14G, which is formed below the second photosensitive resin layer 13G, can be protected by the second photosensitive resin layer 13G. In addition, the lower, third charge transport layer 14R, which is formed below the third photosensitive resin layer 13R, can be protected by the third photosensitive resin layer 13R. In addition, the lower, first charge transport layer 14B, the first light-emitting layer 15B, and the upper, first charge transport layer 17B, which are all formed below the other, first photosensitive resin layer 16B, can be protected by the other, first photosensitive resin layer 16B. In addition, the lower, second charge transport layer 14G, the second light-emitting layer 15G, and the upper, second charge transport layer 17G, which are all formed below the other, second photosensitive resin layer 16G, can be protected by the other, second photosensitive resin layer 16G. In addition, the lower, third charge transport layer 14R, the third light-emitting layer 15R, and the upper, third charge transport layer 17R, which are all formed below the other, third photosensitive resin layer 16R, can be protected by the other, third photosensitive resin layer 16R. Hence, the lower, first charge transport layer 14B, the first light-emitting layer 15B, the upper, first charge transport layer 17B, the lower, second charge transport layer 14G, the second light-emitting layer 15G, the upper, second charge transport layer 17G, the lower, third charge transport layer 14R, the third light-emitting layer 15R, and the upper, third charge transport layer 17R can be restrained from being damaged during the manufacture of the display device 2M and the display device 2N, especially during the development.

3 Embodiment 3

The following will describe differences between Embodiment 2 and Embodiment 3. The description may be silent about some structures and features that are common to Embodiment 2 and Embodiment 3.

Figure 23:
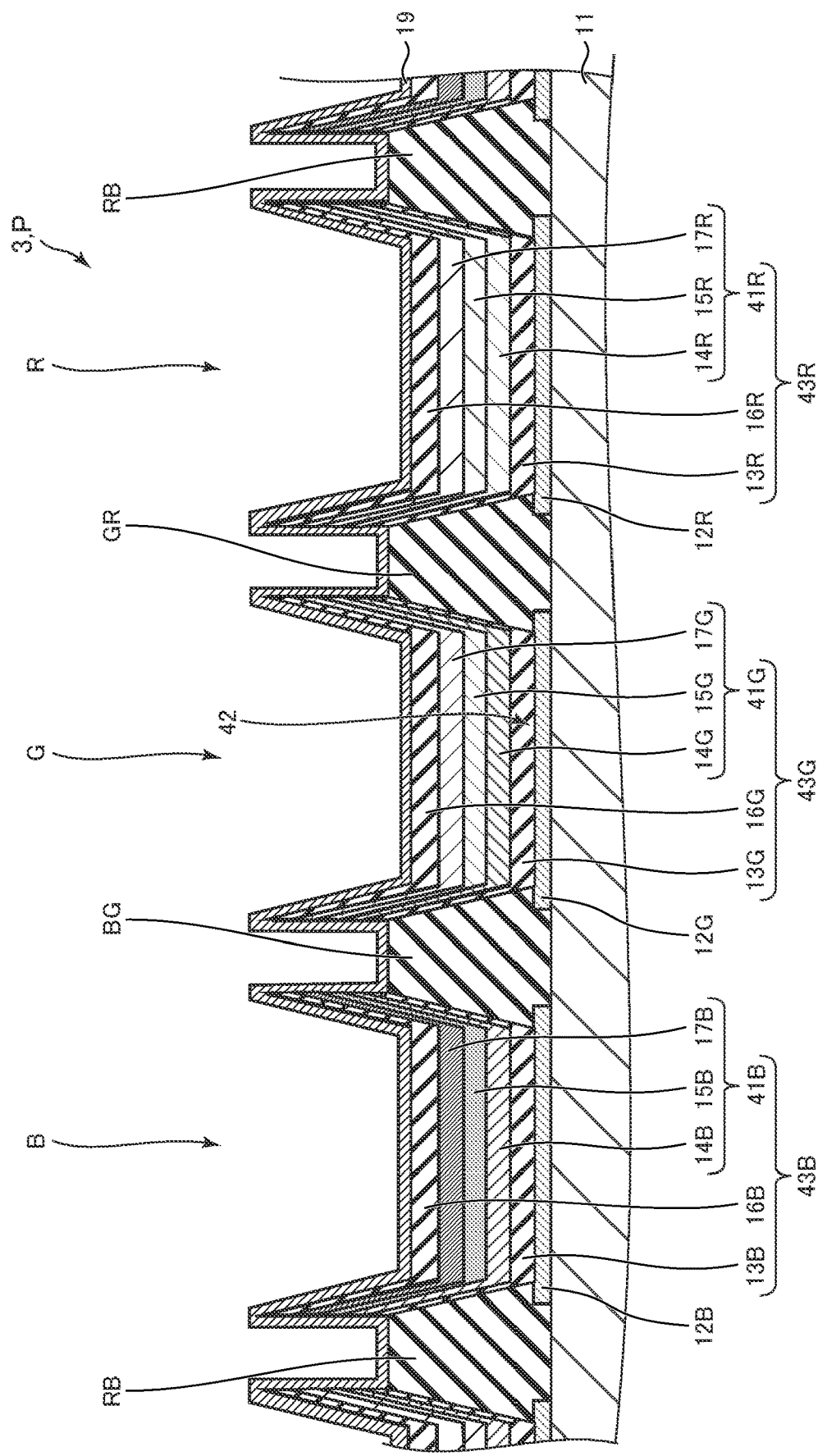
FIG. 23 is a schematic cross-sectional view of each pixel in a display device in accordance with Embodiment 3.

FIG. 23 is a schematic cross-sectional view of each pixel P in a display device 3 in accordance with Embodiment 3.

Referring to FIG. 23, in accordance with Embodiment 3, the other, first photosensitive resin layer 16B, the other, second photosensitive resin layer 16G, and the other, third photosensitive resin layer 16R are disposed on the upper, first charge transport layer 17B, the upper, second charge transport layer 17G, and the upper, third charge transport layer 17R respectively and disposed below the common electrode 19.

Figure 24:
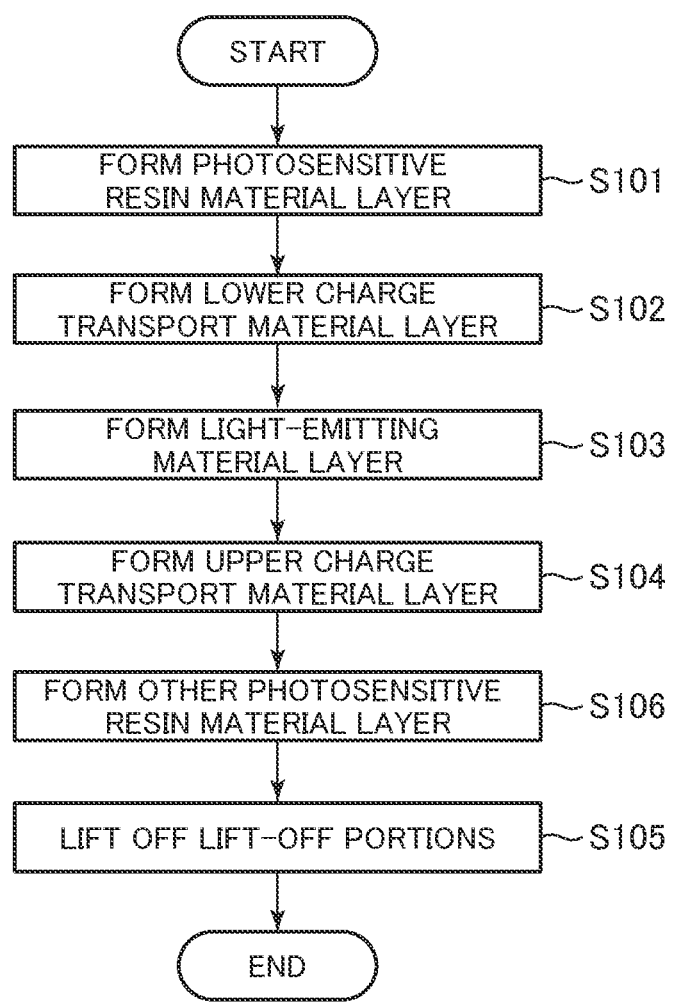
FIG. 24 is a flow chart representing a formation flow for each interelectrode layer in the display device in accordance with Embodiment 3.

FIG. 24 is a flow chart representing a formation flow for each interelectrode layer in the display device 3 in accordance with Embodiment 3.

Referring to FIG. 24, similarly to Embodiment 2, steps S101 to S106 are performed to form each of the first interelectrode layer 43B, the second interelectrode layer 43G, and the third interelectrode layer 43R.

In accordance with Embodiment 3, another photosensitive resin material layer is formed on the substrate 42 in step S106, which follows steps S101, S102, S103, and S104 and precedes step S105.

In addition, in step S105, when lift-off portions are lifted off, the non-lift-off portions of the other photosensitive resin material layer are retained without being lifted off, and the lift-off portions of the other photosensitive resin material layer are lifted off. Hence, the other photosensitive resin material is patterned into another photosensitive resin layer.

Embodiment 3 has similar effects to Embodiment 2.

In addition, in Embodiment 3, the lower, first charge transport layer 14B, the first light-emitting layer 15B, and the upper, first charge transport layer 17B, which are formed below the other, first photosensitive resin layer 16B, can be protected by the other, first photosensitive resin layer 16B. In addition, the lower, second charge transport layer 14G, the second light-emitting layer 15G, and the upper, second charge transport layer 17G, which are formed below the other, second photosensitive resin layer 16G, can be protected by the other, second photosensitive resin layer 16G. In addition, the lower, third charge transport layer 14R, the third light-emitting layer 15R, and the upper, third charge transport layer 17R, which are formed below the other, third photosensitive resin layer 16R, can be protected by the other, third photosensitive resin layer 16R. Hence, the lower, first charge transport layer 14B, the first light-emitting layer 15B, the upper, first charge transport layer 17B, the lower, second charge transport layer 14G, the second light-emitting layer 15G, the upper, second charge transport layer 17G, the lower, third charge transport layer 14R, the third light-emitting layer 15R, and the upper, third charge transport layer 17R can be restrained from being damaged during the manufacture of the display device 3, especially during the development.

4 Embodiment 4

The following will describe differences between Embodiment 3 and Embodiment 4. The description may be silent about some structures and features that are common to Embodiment 3 and Embodiment 4.

Figure 25:
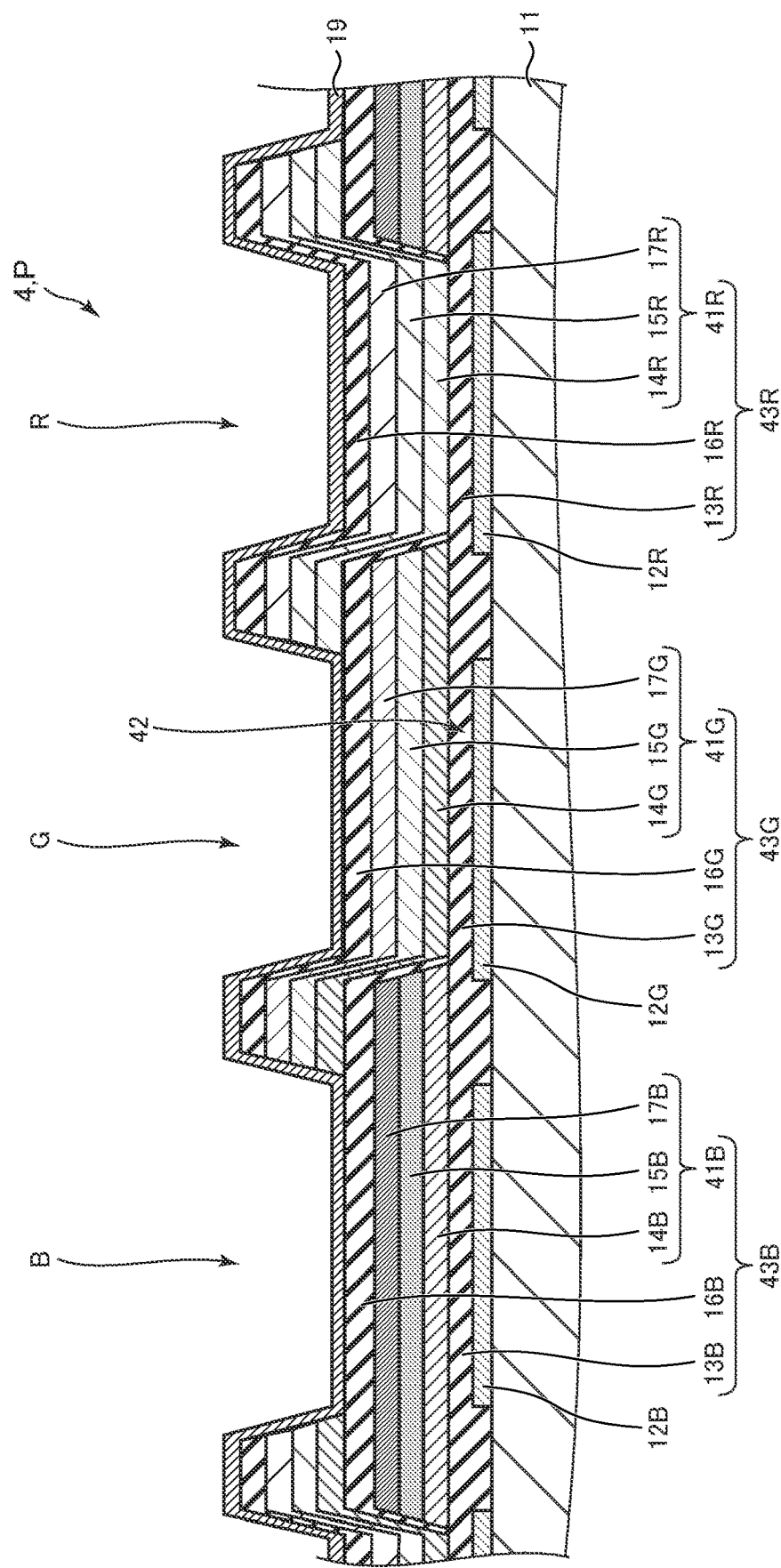
FIG. 25 is a schematic cross-sectional view of each pixel in a display device in accordance with Embodiment 4.

FIG. 25 is a schematic cross-sectional view of each pixel P in a display device 4 in accordance with Embodiment 4.

In Embodiment 4, each pixel P includes no first bank BG, no second bank GR, and no third bank RB.

In addition, in Embodiment 4, the edges of the first photosensitive resin layer 13B, the lower, first charge transport layer 14B, the first light-emitting layer 15B, the upper, first charge transport layer 17B, and the other, first photosensitive resin layer 16B overlap the edges of the second photosensitive resin layer 13G, the lower, second charge transport layer 14G, the second light-emitting layer 15G, the upper, second charge transport layer 17G, and the other, second photosensitive resin layer 16G above the electrode-to-electrode interval between the first pixel electrode 12B and the second pixel electrode 12G. In addition, the edges of the second photosensitive resin layer 13G, the lower, second charge transport layer 14G, the second light-emitting layer 15G, the upper, second charge transport layer 17G, and the other, second photosensitive resin layer 16G overlap the edges of the third photosensitive resin layer 13R, the lower, third charge transport layer 14R, the third light-emitting layer 15R, the upper, third charge transport layer 17R, and the other, third photosensitive resin layer 16R above the electrode-to-electrode interval between the second pixel electrode 12G and the third pixel electrode 12R. In addition, the edges of the third photosensitive resin layer 13R, the lower, third charge transport layer 14R, the third light-emitting layer 15R, the upper, third charge transport layer 17R, and the other, second photosensitive resin layer 16G overlap the edges of the first photosensitive resin layer 13B, the lower, first charge transport layer 14B, the first light-emitting layer 15B, the upper, first charge transport layer 17B, and the other, first photosensitive resin layer 16B above the electrode-to-electrode interval between the third pixel electrode 12R and the first pixel electrode 12B.

In Embodiment 4, in step S105, when lift-off portions are lifted off, the end-overlying portions of the photosensitive resin material layer, the lower charge transport material layer, the light-emitting material layer, the upper charge transport material layer, and the other photosensitive resin material layer, which are formed on an end of an electrode, are retained without being lifted off. For instance, when the first interelectrode layer 43B is formed, the end-overlying portions of the first photosensitive resin material layer 23B, the first charge transport material layer 24B, the first light-emitting material layer 25B, the upper, first charge transport material layer 27B, and the other, first photosensitive resin material layer 26B, which are formed on an end of the first pixel electrode 12B, are retained without being lifted off. In addition, when the second interelectrode layer 43G is formed, the end-overlying portions of the second photosensitive resin material layer 23G, the second charge transport material layer 24G, the second light-emitting material layer 25G, the second charge transport material layer 27G, and the other, second photosensitive resin material layer 26G, which are formed on an end of the second pixel electrode 12G, are retained without being lifted off. In addition, when the third interelectrode layer 43R is formed, the end-overlying portions of the third photosensitive resin material layer 23R, the third charge transport material layer 24R, the third light-emitting material layer 25R, the third charge transport material layer 27R, and the other, third photosensitive resin material layer 26R, which are formed on an end of the third pixel electrode 12R, are retained without being lifted off.

Embodiment 4 has similar effects to Embodiment 3.

In addition, although no first bank BG, no second bank GR, and no third bank RB are provided in Embodiment 4, edges leaks can be restrained similarly to cases where the first bank BG, the second bank GR, and the third bank RB are provided.

5 Embodiment 5

The following will describe differences between Embodiment 3 and Embodiment 5. The description may be silent about some structures and features that are common to Embodiment 3 and Embodiment 5.

Figure 26:
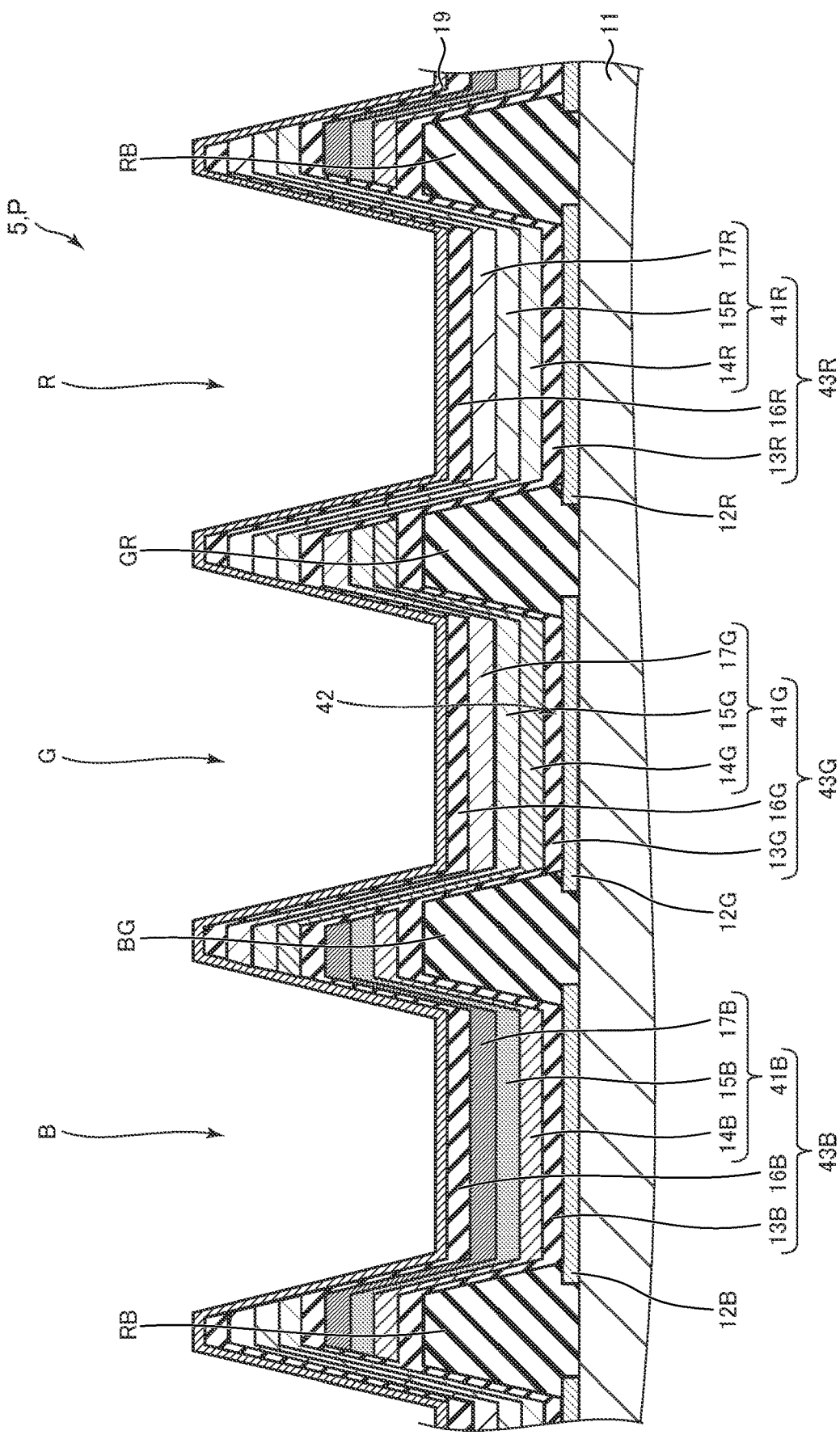
FIG. 26 is a schematic cross-sectional view of each pixel in a display device in accordance with Embodiment 5.

FIG. 26 is a schematic cross-sectional view of each pixel P in a display device 5 in accordance with Embodiment 5.

In Embodiment 5, the edges of the first photosensitive resin layer 13B, the lower, first charge transport layer 14B, the first light-emitting layer 15B, the upper, first charge transport layer 17B, and the other, first photosensitive resin layer 16B overlap the edges of the second photosensitive resin layer 13G, the lower, second charge transport layer 14G, the second light-emitting layer 15G, the upper, second charge transport layer 17G, and the other, second photosensitive resin layer 16G above the first bank BG. In addition, the edges of the second photosensitive resin layer 13G, the lower, second charge transport layer 14G, the second light-emitting layer 15G, the upper, second charge transport layer 17G, and the other, second photosensitive resin layer 16G overlap the edges of the third photosensitive resin layer 13R, the lower, third charge transport layer 14R, the third light-emitting layer 15R, the upper, third charge transport layer 17R, and the other, third photosensitive resin layer 16R above the second bank GR. In addition, the edges of the third photosensitive resin layer 13R, the lower, third charge transport layer 14R, the third light-emitting layer 15R, the upper, third charge transport layer 17R, and the other, second photosensitive resin layer 16G overlap the edges of the first photosensitive resin layer 13B, the lower, first charge transport layer 14B, the first light-emitting layer 15B, the upper, first charge transport layer 17B, and the other, first photosensitive resin layer 16B above the third bank RB.

Embodiment 5 has similar effects to Embodiment 3.

In addition, in Embodiment 5, leaks via the portions above the first bank BG, the second bank GR, and the third bank RB can be restrained. Hence, the first light-emitting element B, the second light-emitting element G, and the third light-emitting element R exhibit improved luminous efficiency.

6 Embodiment 6

The following will describe differences between Embodiment 3 and Embodiment 6. The description may be silent about some structures and features that are common to Embodiment 3 and Embodiment 6.

Figure 27:
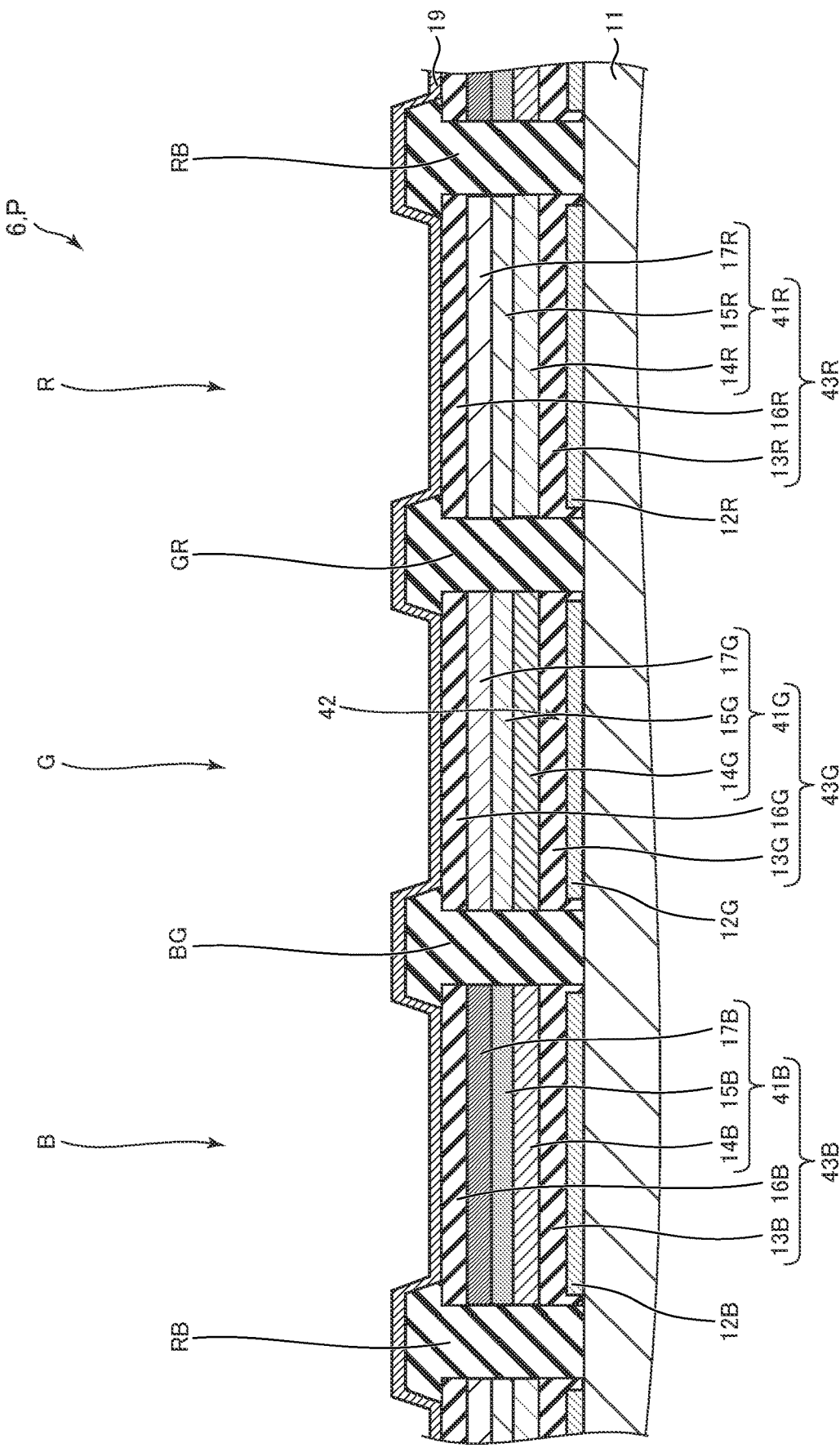
FIG. 27 is a schematic cross-sectional view of each pixel in a display device in accordance with Embodiment 6.

FIG. 27 is a schematic cross-sectional view of each pixel P in a display device 6 in accordance with Embodiment 6.

Referring to FIG. 27, in Embodiment 6, the edges of the first pixel electrode 12B, the first photosensitive resin layer 13B, the lower, first charge transport layer 14B, the first light-emitting layer 15B, the upper, first charge transport layer 17B, the other, first photosensitive resin layer 16B, the second pixel electrode 12G, the second photosensitive resin layer 13G, the lower, second charge transport layer 14G, the second light-emitting layer 15G, the upper, second charge transport layer 17G, and the other, second photosensitive resin layer 16G are not disposed above the first bank BG. In addition, the edges of the second pixel electrode 12G, the second photosensitive resin layer 13G, the lower, second charge transport layer 14G, the second light-emitting layer 15G, the upper, second charge transport layer 17G, the other, second photosensitive resin layer 16G, the third pixel electrode 12R, the third photosensitive resin layer 13R, the lower, third charge transport layer 14R, the third light-emitting layer 15R, the upper, third charge transport layer 17R, and the other, third photosensitive resin layer 16R are not disposed above the second bank GR. In addition, the edges of the third pixel electrode 12R, the third photosensitive resin layer 13R, the lower, third charge transport layer 14R, the third light-emitting layer 15R, the upper, third charge transport layer 17R, the other, third photosensitive resin layer 16R, the first pixel electrode 12B, the first photosensitive resin layer 13B, the lower, first charge transport layer 14B, the first light-emitting layer 15B, the upper, first charge transport layer 17B, and the other, first photosensitive resin layer 16B are not disposed above the third bank RB.

Figure 28:
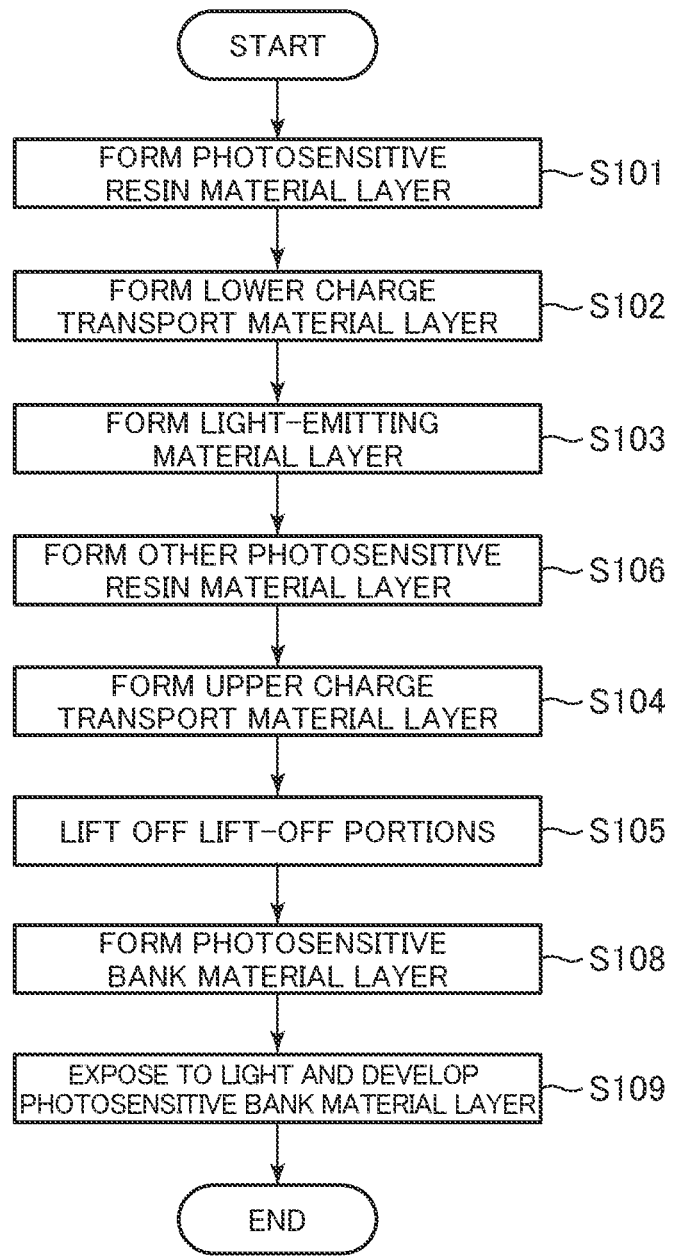
FIG. 28 is a flow chart representing a formation flow for each interelectrode layer in the display device in accordance with Embodiment 6.

FIG. 28 is a flow chart representing a formation flow for each interelectrode layer in the display device 6 in accordance with Embodiment 6. FIGS. 29 to 32 are schematic cross-sectional views of an intermediate article obtained in forming the second interelectrode layer 43G in the display device 6 in accordance with Embodiment 6.

Referring to FIG. 28, similarly to Embodiment 3, steps S101 to S106 are performed to form the second interelectrode layer 43G. In addition, steps S108 and S109 are further performed to form the second interelectrode layer 43G.

Figure 29:
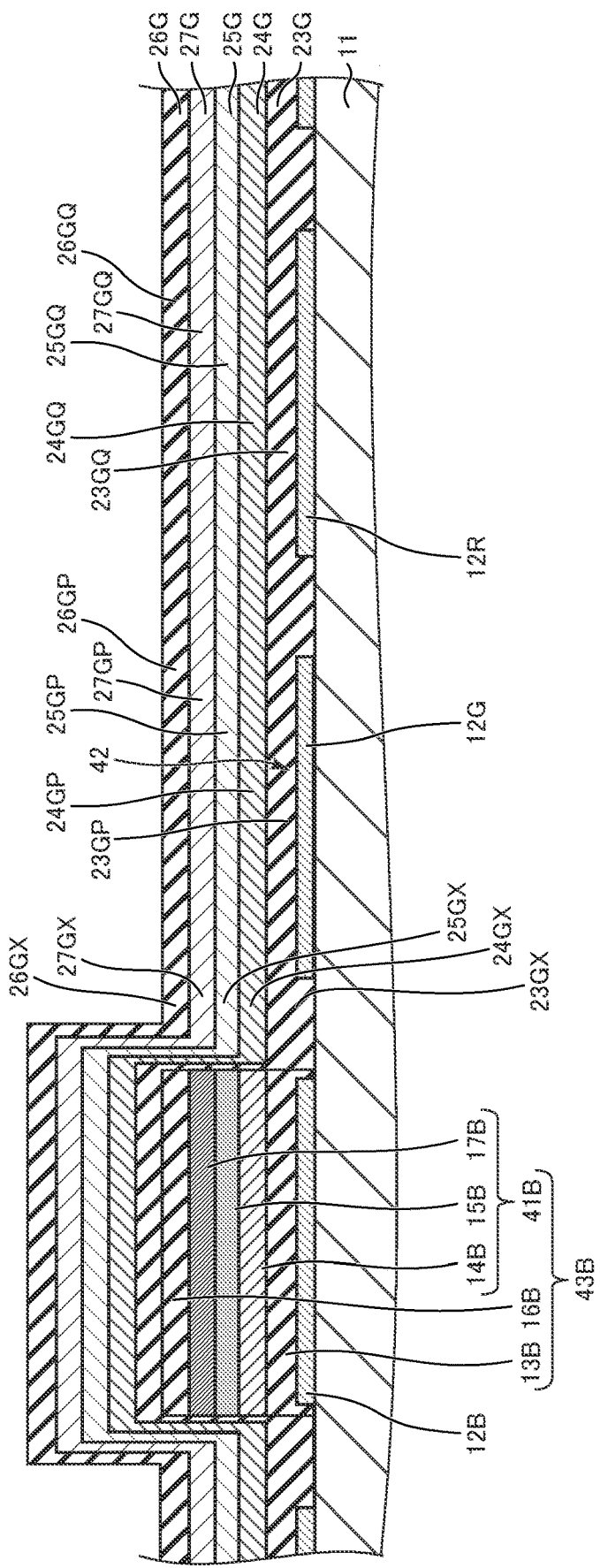
FIG. 29 is a schematic cross-sectional view of an intermediate article obtained in forming a second interelectrode layer in the display device in accordance with Embodiment 6.
Figure 30:
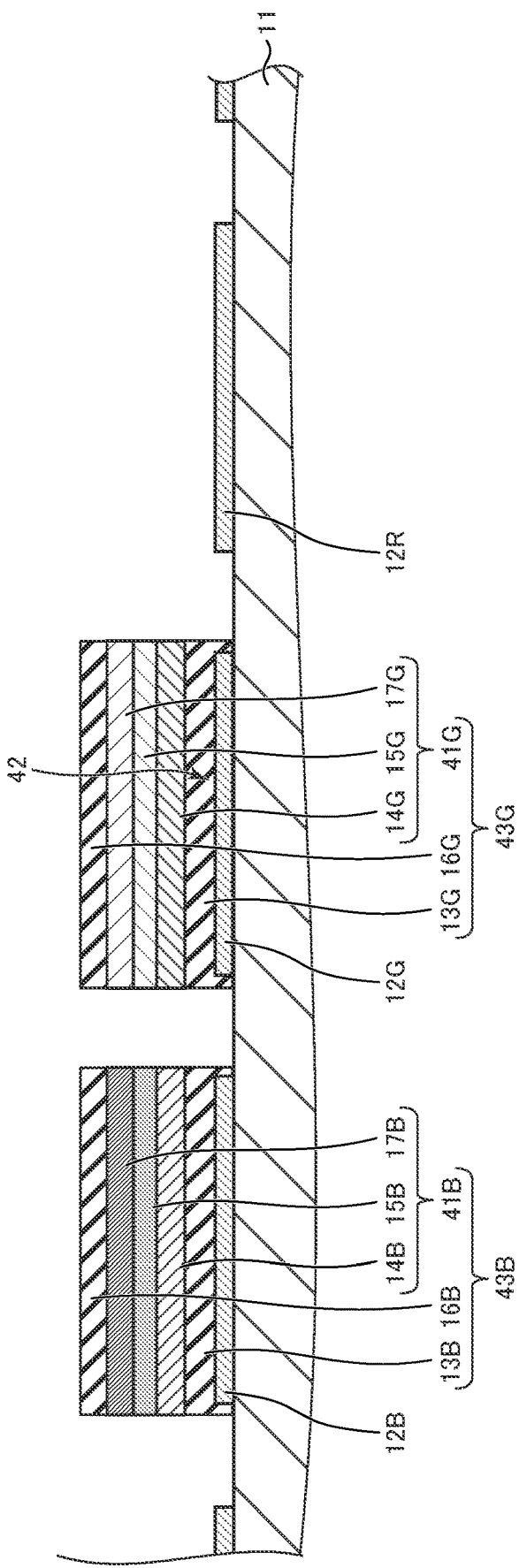
FIG. 30 is a schematic cross-sectional view of an intermediate article obtained in forming the second interelectrode layer in the display device in accordance with Embodiment 6.

In step S105, when the lift-off portion 23GQ, the lift-off portion 24GQ, the lift-off portion 25GQ, the lift-off portion 27GQ, and the lift-off portion 26GQ are lifted off, an interelectrode upper portion 23GX of the second photosensitive resin material layer 23G, an interelectrode upper portion 24GX of the second charge transport material layer 24G, an interelectrode upper portion 25GX of the second light-emitting material layer 25G, an interelectrode upper portion 27X of the second charge transport material layer 27G, and an interelectrode upper portion 26GX of other, second photosensitive resin material layer 26G, which are shown in FIG. 29 and disposed above the electrode-to-electrode interval between the first pixel electrode 12B and the second pixel electrode 12G, are lifted off. Hence, the intermediate article shown in FIG. 30 is obtained.

Figure 31:
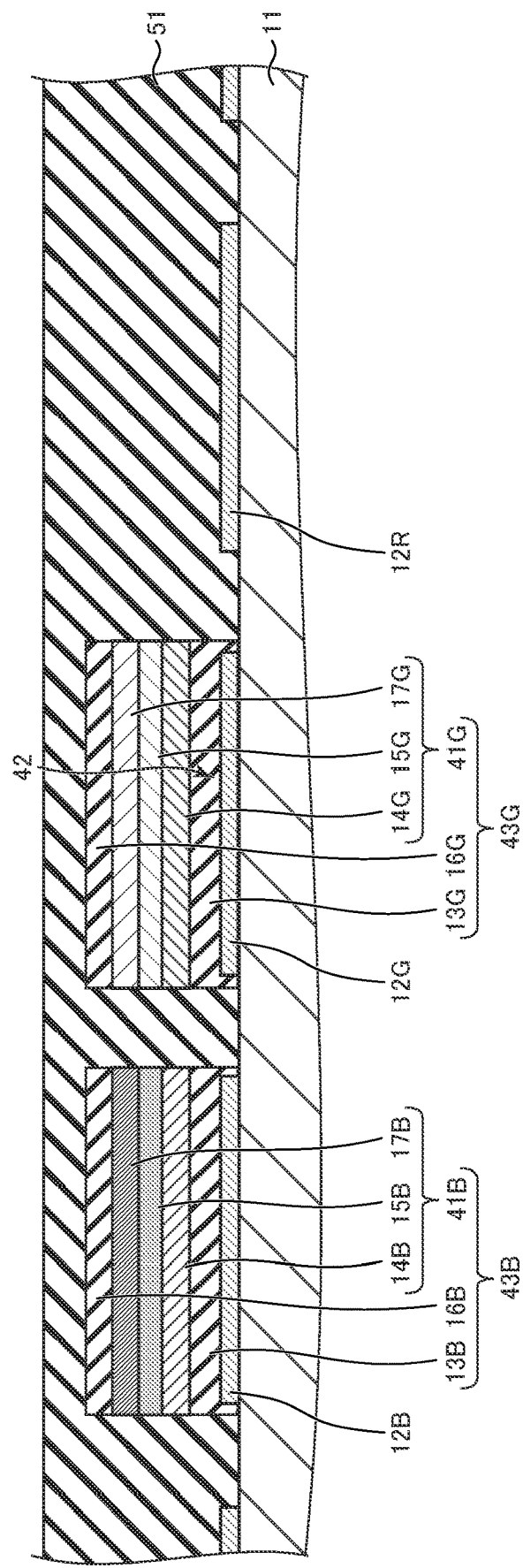
FIG. 31 is a schematic cross-sectional view of an intermediate article obtained in forming the second interelectrode layer in the display device in accordance with Embodiment 6.

In step S108, which follows step S105, as shown in FIG. 31, a photosensitive bank material layer 51 is formed on the substrate 11. The photosensitive bank material layer 51 penetrates a portion where there were the interelectrode upper portion 23GX, the interelectrode upper portion 24GX, the interelectrode upper portion 25GX, the interelectrode upper portion 27X, and the interelectrode upper portion 26GX.

Figure 32:
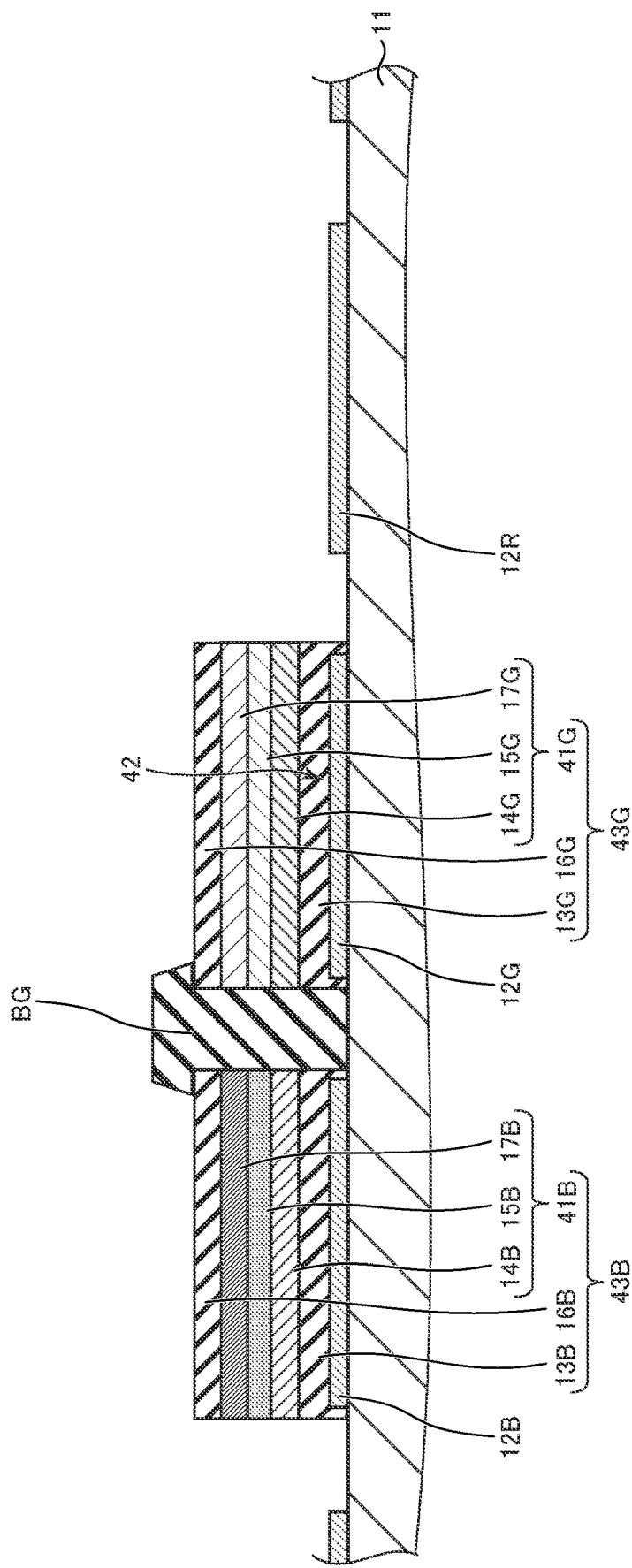
FIG. 32 is a schematic cross-sectional view of an intermediate article obtained in forming the second interelectrode layer in the display device in accordance with Embodiment 6.

In step S109, which follows step S108, as shown in FIG. 32, the photosensitive bank material layer 51 is exposed to light and developed to form the first bank BG above the electrode-to-electrode interval between the first pixel electrode 12B and the second pixel electrode 12G.

The second bank GR and the third bank RB are also formed similarly to the first bank BG.

Embodiment 6 has similar effects to Embodiment 3.

In addition, in Embodiment 6, the lower, first charge transport layer 14B, the lower, second charge transport layer 14G, and the lower, third charge transport layer 14R, which are disposed below the first light-emitting layer 15B, the second light-emitting layer 15G, and the third light-emitting layer 15R respectively, are so much separated from each other as to not overlap and segregated from each other by the first bank BG, the second bank GR, and the third bank RB. Hence, leaks are restrained between the first light-emitting element B, the second light-emitting element G, and the third light-emitting element R.

The present disclosure is not limited to the description of the embodiments and examples above. Any structure detailed in the embodiments and examples may be replaced by a practically identical structure, a structure that achieves the same effect and function, or a structure that achieves the same purpose.

The invention claimed is:

1. A method of manufacturing a display device, the method comprising:
   a) a step of preparing a substrate including
      an electrode and
      another electrode separated by a distance from the electrode in a plan view;
   b) a step, following step a), of forming a photosensitive resin material layer on the substrate;
   c) a step, following step b), of forming a charge transport material layer and a light-emitting material layer on the substrate so that an entire region where the charge transport material layer and the electrode overlap and an entire region where the light-emitting material layer and the electrode overlap overlap the photosensitive resin material layer; and
   d) a step, following step c), of patterning the photosensitive resin material layer, the charge transport material layer, and the light-emitting material layer into a photosensitive resin layer, a charge transport layer, and a light-emitting layer respectively by
      exposing to light, and developing, the photosensitive resin material layer using a photomask,
      retaining, without lifting off, non-lift-off portions of the photosensitive resin material layer, the charge transport material layer, and the light-emitting material layer, the non-lift-off portions being provided at least on a part of the electrode, and
      lifting off lift-off portions of the photosensitive resin material layer, the charge transport material layer, and the light-emitting material layer, the lift-off portions being provided at least on a part of the other electrode.

2. The method according to claim 1, wherein step d) retains, without lifting off, end-overlying portions of the photosensitive resin material layer, the charge transport material layer, and the light-emitting material layer, the end-overlying portions being provided on an end of the electrode.

3. The method according to claim 1, comprising:
   e) a step of performing step b) to step d) using a first electrode as the electrode, a first photosensitive resin material layer as the photosensitive resin material layer, a first charge transport material layer as the charge transport material layer, and a first light-emitting material layer as the light-emitting material layer, to obtain a first photosensitive resin layer, a first charge transport layer, and a first light-emitting layer that emits light of a first color as the photosensitive resin layer, the charge transport layer, and the light-emitting layer respectively; and
   f) a step, following step e), of performing step b) to step d) using a second electrode as the electrode, a second photosensitive resin material layer as the photosensitive resin material layer, a second charge transport material layer as the charge transport material layer, and a second light-emitting material layer as the light-emitting material layer, to obtain a second photosensitive resin layer, a second charge transport layer, and a second light-emitting layer that emits light of a second color that differs from the first color as the photosensitive resin layer, the charge transport layer, and the light-emitting layer respectively.

4. The method according to claim 3, comprising g) a step, following step f), of performing step b) to step d) using a third electrode as the electrode, a third photosensitive resin material layer as the photosensitive resin material layer, a third charge transport material layer as the charge transport material layer, and a third light-emitting material layer as the light-emitting material layer, to obtain a third photosensitive resin layer, a third charge transport layer, and a third light-emitting layer that emits light of a third color that differs from the first color and the second color as the photosensitive resin layer, the charge transport layer, and the light-emitting layer respectively.

5. The method according to claim 3, wherein step f), in performing step d), lifts off interelectrode upper portions of the photosensitive resin layer, the charge transport material layer, and the light-emitting material layer, the interelectrode upper portions being provided on an electrode-to-electrode interval between the electrode and the other electrode, the method comprising:
   h) a step, following step f), of forming a photosensitive bank material layer on the substrate; and
   i) a step, following step h), of exposing to light, and developing, the photosensitive bank material layer to form a bank on the electrode-to-electrode interval.

6. The method according to claim 1, comprising j) a step, following step a), but preceding step b), of forming another charge transport material layer.

7. The method according to claim 1, further comprising k) a step, following step c), but preceding step d), of forming another photosensitive resin material layer on the substrate.

8. The method according to claim 7, wherein step c) comprises:
   c-1) a step of forming the light-emitting material layer; and
   c-2) a step, following step c-1), of forming the charge transport material layer.

* * * * *